(12) United States Patent
Cowe et al.

(10) Patent No.: US 11,854,839 B2
(45) Date of Patent: Dec. 26, 2023

(54) VALVE APPARATUSES AND RELATED METHODS FOR REACTIVE PROCESS GAS ISOLATION AND FACILITATING PURGE DURING ISOLATION

(71) Applicant: MKS Instruments, Inc., Andover, MA (US)

(72) Inventors: Andrew B. Cowe, Andover, MA (US); Gordon Hill, Arlington, MA (US)

(73) Assignee: MKS Instruments, Inc., Andover, MA (US)

( * ) Notice: Subject to any disclaimer, the term of this patent is extended or adjusted under 35 U.S.C. 154(b) by 470 days.

(21) Appl. No.: 16/849,871

(22) Filed: Apr. 15, 2020

(65) Prior Publication Data

US 2021/0327727 A1 Oct. 21, 2021

(51) Int. Cl.
| | |
|---|---|
| *F16K 3/02* | (2006.01) |
| *H01L 21/67* | (2006.01) |
| *F16K 3/16* | (2006.01) |
| *C23C 16/44* | (2006.01) |
| *B08B 5/00* | (2006.01) |
| *H01J 37/32* | (2006.01) |
| *F16K 3/18* | (2006.01) |

(52) U.S. Cl.
CPC ......... *H01L 21/67017* (2013.01); *B08B 5/00* (2013.01); *C23C 16/4405* (2013.01); *F16K 3/0227* (2013.01); *F16K 3/16* (2013.01); *F16K 3/18* (2013.01); *H01J 37/32357* (2013.01); *H01J 2237/335* (2013.01)

(58) Field of Classification Search
CPC . F16K 3/0227; F16K 3/04; F16K 3/06; F16K 3/10; F16K 3/207; F16K 3/314; F16K 11/074
See application file for complete search history.

(56) References Cited

U.S. PATENT DOCUMENTS 1,439,720 A * 12/1922 Yarnall ..................... F16K 3/06
  251/327
2,669,416 A *  2/1954 Hilton ..................... F16K 3/316
  251/156

(Continued)

FOREIGN PATENT DOCUMENTS

| EP | 3767250 A2 | 1/2021 |
|---|---|---|
| JP | 2009117444 A | 5/2009 |

(Continued)

*Primary Examiner* — Hailey K. Do
(74) *Attorney, Agent, or Firm* — Cesari and McKenna, LLP

(57) ABSTRACT

An isolation valve assembly including a valve body having an inlet and an outlet. The isolation valve includes a seal plate disposed within an interior cavity of the valve body. The seal plate is movable between a first position allowing gas flow from the inlet to the outlet, and a second position preventing gas flow from the inlet to the outlet. The isolation valve includes a closure element disposed within the valve body. The closure element is configured to retain the seal plate stationary in the first position or the second position. The closure element includes a first sealing element positioned adjacent to a first surface of the seal plate. A working surface of the first sealing element is substantially obscured from the gas flow when the seal plate is stationary.

14 Claims, 14 Drawing Sheets

(56) References Cited

U.S. PATENT DOCUMENTS

| | | | | |
|---|---|---|---|---|
| 3,347,261 A | * | 10/1967 | Yancey | F16K 3/207 137/246.22 |
| 3,610,569 A | * | 10/1971 | Reaves | F16K 31/1225 251/52 |
| 3,842,861 A | * | 10/1974 | Jandrasi | F16K 3/16 251/302 |
| 4,177,833 A | * | 12/1979 | Morrison | F16K 5/0673 137/625.12 |
| 4,535,801 A | * | 8/1985 | Neale | F16K 3/0272 251/327 |
| 4,562,992 A | * | 1/1986 | Sugisaki | F16K 3/20 267/74 |
| 4,909,272 A | * | 3/1990 | Carpentier | F16K 3/0281 137/315.31 |
| 5,382,311 A | | 1/1995 | Ishikawa et al. | |
| 5,388,606 A | | 2/1995 | Banks | |
| 5,577,707 A | * | 11/1996 | Brida | F16K 3/20 251/193 |
| 6,012,509 A | | 1/2000 | Nonaka | |
| 6,179,924 B1 | | 1/2001 | Zhao et al. | |
| 6,260,490 B1 | * | 7/2001 | Wark | F23K 3/02 110/297 |
| 6,688,324 B2 | | 2/2004 | Hoang et al. | |
| 6,800,134 B2 | | 10/2004 | Dando et al. | |
| 7,147,719 B2 | | 12/2006 | Welch et al. | |
| 7,408,225 B2 | | 8/2008 | Shinriki et al. | |
| 7,452,827 B2 | | 11/2008 | Gianoulakis et al. | |
| 8,343,307 B2 | | 1/2013 | Huston | |
| 9,051,647 B2 | | 6/2015 | Cooperberg et al. | |
| 10,612,674 B2 | | 4/2020 | Geiser et al. | |
| 2010/0132891 A1 | | 6/2010 | Nozawa | |
| 2012/0228537 A1 | * | 9/2012 | Kahn | F16K 3/0227 251/328 |
| 2013/0239889 A1 | | 9/2013 | Lien et al. | |
| 2014/0209181 A1 | | 7/2014 | Lucas et al. | |
| 2017/0292633 A1 | | 10/2017 | Hill et al. | |
| 2019/0211935 A1 | | 7/2019 | Wada et al. | |
| 2019/0293199 A1 | | 9/2019 | Carlson et al. | |
| 2021/0020467 A1 | | 1/2021 | Sekiguchi | |

FOREIGN PATENT DOCUMENTS

| | | |
|---|---|---|
| JP | 2018-084242 A | 5/2018 |
| KR | 10-2013-0092076 A | 8/2013 |
| WO | 2019067885 A1 | 4/2019 |
| WO | 2019067948 A1 | 4/2019 |

* cited by examiner

```
800
```

┌──────────────────────────────────────────────────────────────────────┐
│ 805 Securing an outlet of the remote plasma source to an inlet of a valve body of the isolation valve assembly │
└──────────────────────────────────────────────────────────────────────┘
┌──────────────────────────────────────────────────────────────────────┐
│ 810 Positioning a seal plate disposed within an interior cavity of the valve body in a first position, wherein the seal plate comprises a channel directing gas flow from the inlet of the valve body to the interior cavity of the valve body when the seal plate is in the first position │
└──────────────────────────────────────────────────────────────────────┘
┌──────────────────────────────────────────────────────────────────────┐
│ 815 Providing the output of the remote plasma source operation to the inlet of the valve body via the outlet of the remote plasma source │
└──────────────────────────────────────────────────────────────────────┘
┌──────────────────────────────────────────────────────────────────────┐
│ 820 Evacuating the output of the remote plasma source operation from a first aperture disposed in the valve body │
└──────────────────────────────────────────────────────────────────────┘

┌──────────────────────────────────────────────────────────────────────┐
│ 905 Securing an outlet of a remote plasma source to an inlet of a valve body of an isolation valve assembly │
└──────────────────────────────────────────────────────────────────────┘
┌──────────────────────────────────────────────────────────────────────┐
│ 910 Positioning a seal plate disposed within an interior cavity of the valve body in a first position, wherein the seal plate comprises a channel directing gas flow from the inlet of the valve body to an outlet of the valve body │
└──────────────────────────────────────────────────────────────────────┘
┌──────────────────────────────────────────────────────────────────────┐
│ 915 Supplying a reactive species generated in the remote plasma source to the inlet of the valve body │
└──────────────────────────────────────────────────────────────────────┘
┌──────────────────────────────────────────────────────────────────────┐
│ 920 Injecting one or more chemical species into the reactive species via a plurality of injection ports formed in the seal plate │
└──────────────────────────────────────────────────────────────────────┘

FIG. 9

VALVE APPARATUSES AND RELATED METHODS FOR REACTIVE PROCESS GAS ISOLATION AND FACILITATING PURGE DURING ISOLATION

TECHNICAL FIELD

This application relates generally to isolation valves used in semiconductor processing. In particular, this application relates to multi-position isolation valves and related methods of use for preventing the degradation of the valve sealing element and enabling the remote plasma source and valve body to be purged simultaneously with semiconductor fabrication processes.

BACKGROUND

In order to reduce or prevent damage to the wafer and process chamber that can be caused by exposure to chemically corrosive plasmas, many semiconductor processing systems use a remote plasma source ("RPS") to generate a plasma outside the process chamber and then deliver activated gasses (e.g., reactive species, reactive gas) produced by the plasma to the process chamber for processing a wafer or substrate. It can be desirable to install an isolation valve in the aperture or conduit connecting an outlet of the RPS to an inlet of the process chamber. Such a valve can be used to isolate the RPS from the process chamber during deposition operations to prevent, for example, gasses from the process chamber from making their way up into the RPS and condensing or depositing a film on the RPS chamber walls. However, limitations of conventional valves have largely made their use impractical for this application.

Conventional valves that have been considered for use in semiconductor processing systems typically utilize a gate valve or a bellows-sealed poppet isolation valve.

Conventional gate valves typically are shorter in the direction of the gas flow than their poppet valve counterparts, but can be more susceptible to thermal issues. Further, gate valves typically have a large internal wetted surface area that is exposed to the process gas when the valve is open.

A conventional bellows-sealed poppet isolation valve has a mechanically- or pneumatically-actuated piston for extending and retracting a bellows and nosepiece to close and open a gas flow path through the valve body. Such valves often have a valve body arranged in a side port configuration in which the valve opening connected to the RPS outlet is positioned at an angle substantially ninety degrees from the valve opening connected to the process chamber inlet. The nosepiece typically includes a sealing element or o-ring that gets compressed against the valve body surrounding one of the valve openings in order to close the gas flow path. Other valves have a straight valve body arranged such that the gas flow path between the RPS outlet and process chamber inlet is substantially horizontal, and the piston is positioned at an angle to the valve body.

One issue with the valves described above is that semiconductor processing systems are often installed within a facility having limited physical space, and such valves can be large due to the space needed to support the stroke length needed to retract the valve nosepiece. Further, even in the fully open position, the bellows and nosepiece cannot be sufficiently retracted by the piston to be obscured from the path of reactive gasses flowing through the valve body. This reduces the transport efficiency of the reactive gas generated by the RPS that reaches the process chamber due to recombination reactions caused by collisions with the valve bellows and nosepiece. Additionally, when reactive gasses flowing from the RPS contact the surface of the bellows and nosepiece, there is an exothermic reaction that quickly generates enough heat to raise valve components to excessive temperatures outside of their recommended operating range. Accordingly, some valves include channels routed through the valve body and in some cases the nosepiece to allow cooling fluids to be circulated. In addition to these thermal concerns, any stainless steel components such as the valve bellows can cause recombination of reactive gas and loss of transport efficiency.

However, despite the improvements that have been made to address cooling and the corrosion of certain valve components, degradation of the sealing element or o-ring remains a significant enough problem in conventional isolation valves that they are rarely used in the direct flow path between the RPS and process chamber. For example, o-rings are typically fabricated from a perfluoroelastomer material such as DuPont's Kalrez® or Greene Tweed's Chemraz® products. These materials degrade quickly when exposed to reactive gasses such as atomic fluorine, and the speed of degradation is compounded when the gas that the materials are being exposed to is flowing at a high velocity. In particular, the face or sealing surface of the o-ring is subject to the most mechanical stress and is exposed to the most chemical attack, and therefore degrades at a rapid rate.

SUMMARY

There is therefore a need for multi-position isolation valves and related methods of use for preventing the degradation of the valve sealing element. There is also a need for multi-position isolation valves and related methods of use for enabling the remote plasma source and valve body to be purged simultaneously with semiconductor fabrication processes. Further, there is a need for multi-position isolation valves capable of providing a gas flow path though the valve aperture that can be fully open.

The isolation valve described herein overcomes the deficiencies of conventional isolation valves, in part, by exposing far less of the faces or sealing surfaces of its o-rings to reactive gasses and corrosive chemicals passing through the valve body. Accordingly, degradation of the o-rings is significantly reduced which can substantially increase the life expectancy or useable life of the o-rings as compared to those used in conventional isolation valves. For example, the useable life of an o-ring having the features of the isolation valve technology described herein can increase the useable life of an o-ring by several times to that of a conventional isolation valve. Further, the isolation valve described herein enables the gas flow path though the valve aperture to be fully open and unobstructed by other valve components such as a valve nosepiece or a change in direction of the gas flow path through the valve.

The technology, in one aspect, features an isolation valve assembly. The isolation valve assembly includes a valve body having an inlet and an outlet. The isolation valve assembly further includes a seal plate disposed within an interior cavity of the valve body. The seal plate is movable between a first position allowing gas flow from the inlet to the outlet, and a second position preventing gas flow from the inlet to the outlet. The isolation valve assembly further includes a closure element disposed within the valve body configured to retain the seal plate stationary in the first position or the second position. The closure element includes a first sealing element positioned adjacent to a first surface of the seal plate. A working surface of the first sealing element is substantially obscured from the gas flow when the seal plate is stationary.

The isolation valve technology can further include any of the following features. In some embodiments, the closure element further includes a second sealing element positioned adjacent to a second surface of the seal plate. In some embodiments, a working surface of the second sealing element is substantially obscured from the gas flow when the seal plate is stationary. In some embodiments, the closure element is configured to use a compressive force to retain the seal plate stationary in the first position or the second position.

In some embodiments, the first sealing element provides a seal substantially preventing gas flow between the closure element and the first surface of the seal plate when the seal plate is stationary. In some embodiments, the second sealing element provides a seal substantially preventing gas flow between the closure element and the second surface of the seal plate when the seal plate is stationary.

In some embodiments, the isolation valve assembly further includes a first aperture formed in the valve body for receiving a purge gas into the interior cavity of the valve body, and a second aperture formed in the valve body for removing one or more of the purge gas and a residual gas from the interior cavity of the valve body. In some embodiments, the second aperture is formed in the valve body at a position remote from the first aperture. In some embodiments, the second aperture is formed in the valve body at a position on an opposite side of the seal plate as the first aperture. In some embodiments, the second aperture is formed in the valve body at a position that substantially maximizes the flow path between the second aperture and the first aperture within the interior cavity of the valve body.

In some embodiments, the seal plate further includes a channel directing gas flow from the inlet to the interior cavity of the valve body when the seal plate is in the second position. In some embodiments, the isolation valve assembly further includes a plurality of injection ports for injecting one or more chemical species into the gas flow when the seal plate is in the first position. In some embodiments, the plurality of injection ports are formed in the seal plate, in the valve body between the seal plate and the inlet, or in the valve body between the seal plate and the outlet.

In some embodiments, the seal plate is movable between the first position and the second position about a pivot point in a rotational motion. In some embodiments, the seal plate further comprises at least one fluid channel in communication with a fluid inlet of the pivot point. In some embodiments, the seal plate is movable between the first position and the second position in a linear motion.

In some embodiments, a height of the isolation valve assembly is between about 1.5 to about 2 times the measured diameter of either of the inlet and the outlet.

The technology, in another aspect, features a method for directing an output of a remote plasma source operation through a valve body of an isolation valve assembly. The method includes securing an outlet of the remote plasma source to an inlet of the valve body of the isolation valve assembly. The method further includes positioning a seal plate disposed within an interior cavity of the valve body in a first position. The seal plate includes a channel directing gas flow from the inlet of the valve body to the interior cavity of the valve body when the seal plate is in the first position. The method further includes providing the output of the remote plasma source operation to the inlet of the valve body via the outlet of the remote plasma source, and evacuating the output of the remote plasma source operation from a first aperture disposed in the valve body.

The method can further include any of the following features. In some embodiments, evacuating further includes simultaneously performing a semiconductor processing operation in a process chamber in fluid communication with an outlet of the isolation valve assembly. In some embodiments, the output of the remote plasma source operation includes one or more of a purge gas from a gas inlet of the remote plasma source to the outlet, a gas generated during a passivation process performed in a chamber of the remote plasma source, and a reactive species generated by a plasma formed in a chamber of the remote plasma source. In some embodiments, the method further includes flowing a purge gas from a gas inlet of the remote plasma source to the outlet of the remote plasma source.

In some embodiments, the method further includes performing a passivation process in a chamber of the remote plasma source, and flowing a gas generated during the passivation process to the outlet of the remote plasma source. In some embodiments, the method further includes forming a plasma in a chamber of the remote plasma source, and flowing a reactive species generated by the plasma to the outlet of the remote plasma source. In some embodiments, the plasma is an argon plasma or oxygen plasma.

In some embodiments, the method further includes supplying a purge gas to a second aperture disposed in the valve body, and evacuating the purge gas and from the first aperture disposed in the valve body. In some embodiments, evacuating the output of the remote plasma source operation occurs substantially simultaneously with evacuating the purge gas. In some embodiments, evacuating a residual gas from the first aperture disposed in the valve body.

The technology, in another aspect, features a method for reacting a chemical species with a reactive species. The method includes securing an outlet of a remote plasma source to an inlet of a valve body of an isolation valve assembly. The method further includes positioning a seal plate disposed within an interior cavity of the valve body in a first position. The seal plate comprises a channel directing gas flow from the inlet of the valve body to an outlet of the valve body. The method further includes supplying a reactive species generated in the remote plasma source to the inlet of the valve body, and injecting one or more chemical species into the reactive species via a plurality of injection ports formed in the seal plate.

BRIEF DESCRIPTION OF THE DRAWINGS

The advantages of the systems and methods described herein, together with further advantages, may be better understood by referring to the following description taken in conjunction with the accompanying drawings. The drawings are not necessarily to scale, emphasis instead generally being placed upon illustrating the principles of the described embodiments by way of example only.

FIG. 8 is a flow diagram of a method for directing an output of a remote plasma source operation through a valve body of an isolation valve assembly, according to embodiments of the technology described herein.

FIG. 9 is a flow diagram of a method for reacting a chemical species with a reactive species, according to embodiments of the technology described herein.

DETAILED DESCRIPTION

Figure 1A:
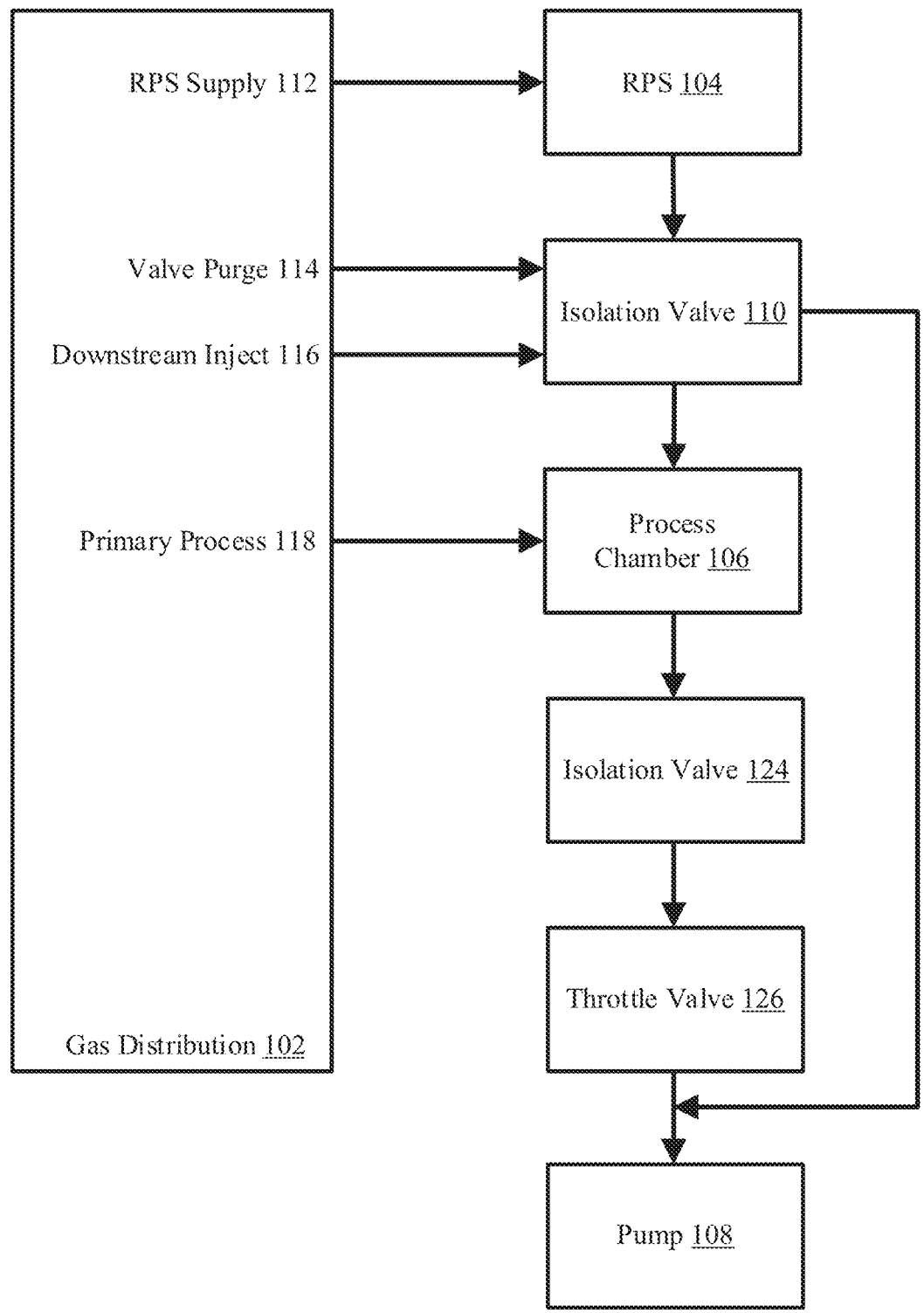
FIG. 1A is a block diagram of a semiconductor processing system including an isolation valve according to embodiments of the technology described herein.

FIG. 1A is a block diagram of a semiconductor processing system 100a including an isolation valve according to embodiments of the technology described herein. System 100a includes remote plasma source 104 (hereinafter, "RPS 104") in communication with process chamber 106 via isolation valve 110. Process chamber 106 is in communication with isolation valve 110b, which in turn is in communication with throttle valve 126. In some embodiments, throttle valve 126 is a T3B throttle valve manufactured by MKS Instruments, Inc. of Andover, MA Pump 108 is in communication with isolation valve 110 and an output of throttle valve 126 for circulating gasses within the components of system 100a. Gas distribution 102 is in communication with RPS 104, isolation valve 110, process chamber 106, and isolation valve 110b.

RPS 104 generates an active gas species for use in a semiconductor fabrication process. For example, using gasses supplied by gas distribution 102, RPS 104 can ignite a plasma and generate a reactive gas (e.g. atomic fluorine) typically used to clean a process chamber (e.g., process chamber 106) after a deposition process. In some embodiments, RPS 104 is an ASTRON® remote plasma source manufactured by MKS Instruments, Inc. of Andover, MA.

Isolation valve 110 can be installed in the path between RPS 104 and process chamber 106 to provide a flow path for the reactive gas when isolation valve 110 is in an open position, and for isolating RPS 104 from process chamber 106 when isolation valve 110 is in a closed position. RPS 104 is isolated from process chamber 106 during deposition operations to prevent, for example, gasses from process chamber 106 from making their way up into the RPS and condensing or depositing a film on the chamber walls of RPS 104. Isolating RPS 104 from process chamber 106 with such a valve also allows RPS 104 to be purged and/or reconditioned/passivated with alternate process gas(es) without affecting processes being carried out in process chamber 106. Further, as described herein, isolation valve 110 can include features allowing its valve body to be purged with a purge gas supplied by gas distribution 102 and removed from the valve body via pump 108. For example, isolation valve 110 can include one or more inlet ports for injecting a gas into the valve body, and one or more outlet ports for drawing gas from the valve body. The purging and/or reconditioning/passivation operations can be performed simultaneously with processes being carried out in process chamber 106 if desired. Advantageously, this can decrease the unproductive downtime of the semiconductor processing system that would typically be necessary for performing maintenance operations.

Isolation valve 110 can also include features to enable injection of substances downstream of RPS 104 for enhancing the semiconductor processing operations performed in process chamber 106. In some embodiments, isolation valve 110 includes features enabling water vapor or other process gasses to be injected into the stream of reactive gas provided from RPS 104.

Gas distribution 102 represents several sources of gas and supplies all of the gasses used by the components of system 100a to carry out the various processes described herein. Gas distribution 102 includes RPS supply 112 which represents sources of one or more process gasses supplied to RPS 104. For example, $NF_3$ and Ar are typically used for chamber clean. Certain cleaning, etching, or photoresist strip applications may use $NH_3$, $H_2$, $O_2$, or other gasses. RPS supply 112 also represents sources of one or more gasses used to purge RPS 104 (e.g., Ar, $N_2$). Gas distribution 102 also includes valve purge 114 which represents sources of one or more gasses used to purge isolation valve 110 (e.g., Ar, $N_2$), and downstream inject 116 which represents sources of one or more gasses injected downstream of RPS 104 (e.g., water vapor, $N_2$, $H_2$, $NH_3$, $O_2$). Finally, gas distribution 102 includes primary process 118 which represents sources of one or more process gasses used in process chamber 106 (e.g., TEOS, $O_3$, Silane, $O_2$).

Although shown in FIG. 1A as a single component, one of ordinary skill in the art will appreciate that gas distribution 102 can be made up of several gas sources and other supporting components that are not physically collocated with one another. One of ordinary skill in the art will further appreciate that the arrows in FIG. 1A showing the flow direction and connection paths between the various components of system 100a can implemented as more than one physical path in practice, and that each component of system 100a can comprise a plurality of components. For example, although pump 108 is shown as a single pump for drawing gas from both process chamber 106 and isolation valve 110, in practice pump 108 may comprise one or more pumps for drawing gas from a point downstream of throttle valve 126, and an additional one or more pumps for drawing purge gas from isolation valve 110.

Figure 1B:
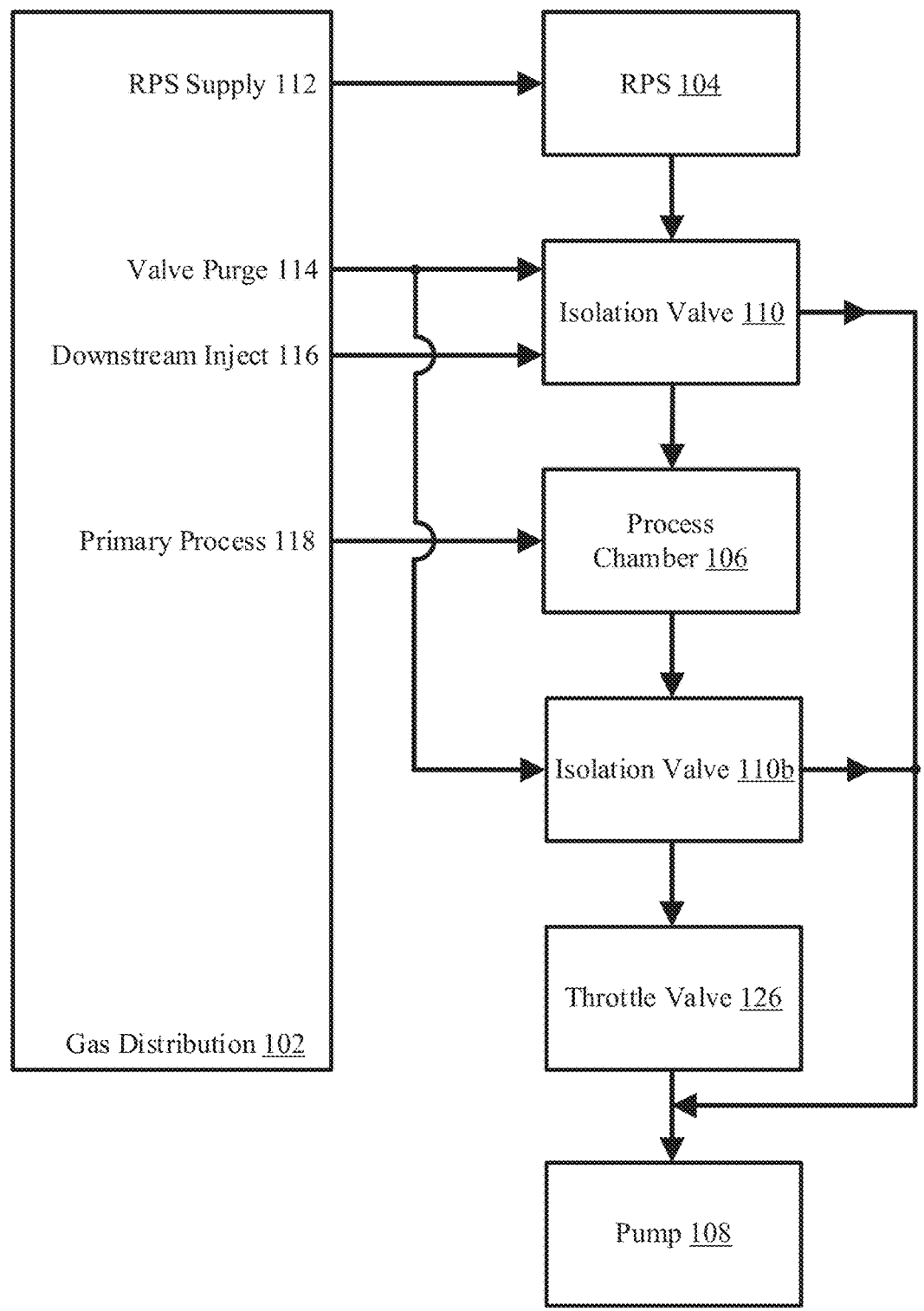
FIG. 1B is a block diagram of a semiconductor processing system including isolation valves according to embodiments of the technology described herein.

FIG. 1B is a block diagram of a semiconductor processing system 100b including isolation valves according to embodiments of the technology described herein. System 100b includes many of the same components as system 100a, but alternatively includes isolation valve 110b in place of isolation valve 124. (Unless a specific version of the system is referenced, system 100a and system 100b are hereinafter referred to interchangeably as "system 100.") Further, valve purge 114 is in fluid communication with isolation valve 110b which is in fluid communication with the output of throttle valve 126 and pump 108.

In system 100b, isolation valve 110b can be the same type of valve as isolation valve 110 to enhance the performance of the system. For example, conventional isolation valves positioned at the outlet of a process chamber are typically subject to buildup of the byproducts of the processes (e.g., SiO2, SiN, or metal oxide deposition processes) carried out in the process chamber. Byproducts from such processes (e.g., SiO2, SiN, or metal oxide powder) tend to collect on the seat surfaces of conventional isolation valves, consequently causing the valves to fail to seal properly. Accordingly, using the isolation valve described herein between process chamber 106 and throttle valve 126 can provide advantages for semiconductor processes based on the features of the isolation valve discussed throughout this disclosure. For example, the enhanced ability of the isolation valve to shield the o-ring from reactive species and process byproducts can improve the valve's ability to maintain a positive seal. Further, the valve's ability to be purged by gasses from valve purge 114 can further reduce or eliminate the negative effects of byproduct buildup on the sealing ability of the valve in that location.

Figure 2:
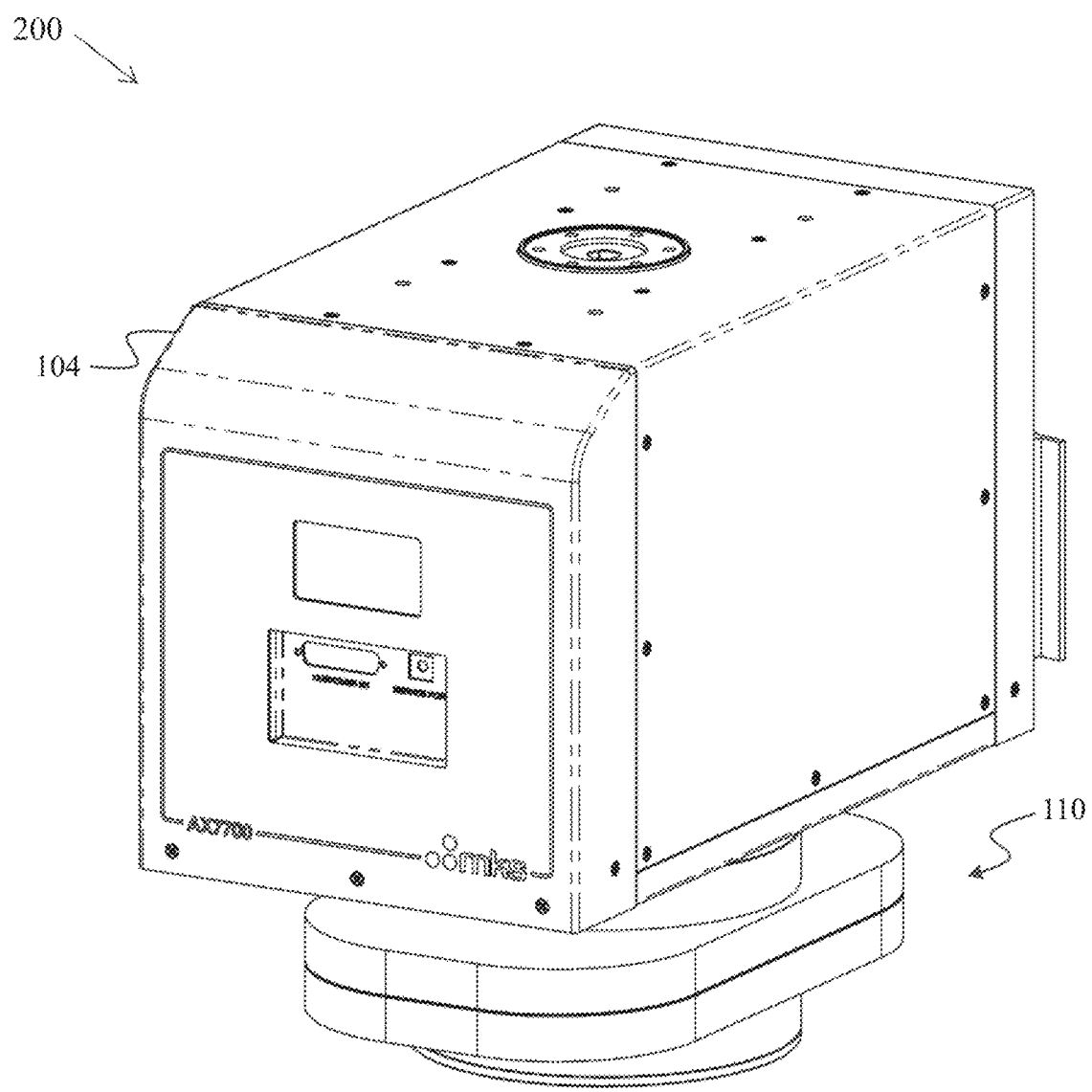
FIG. 2 is a diagram of an RPS connected to an isolation valve according to embodiments of the technology described herein.

FIG. 2 is a diagram 200 showing an exemplary RPS connected to an isolation valve according to embodiments of the technology described herein. As shown in diagram 200, isolation valve 110 can be mounted directly or adjacent to an outlet of RPS 104.

Figure 3A:
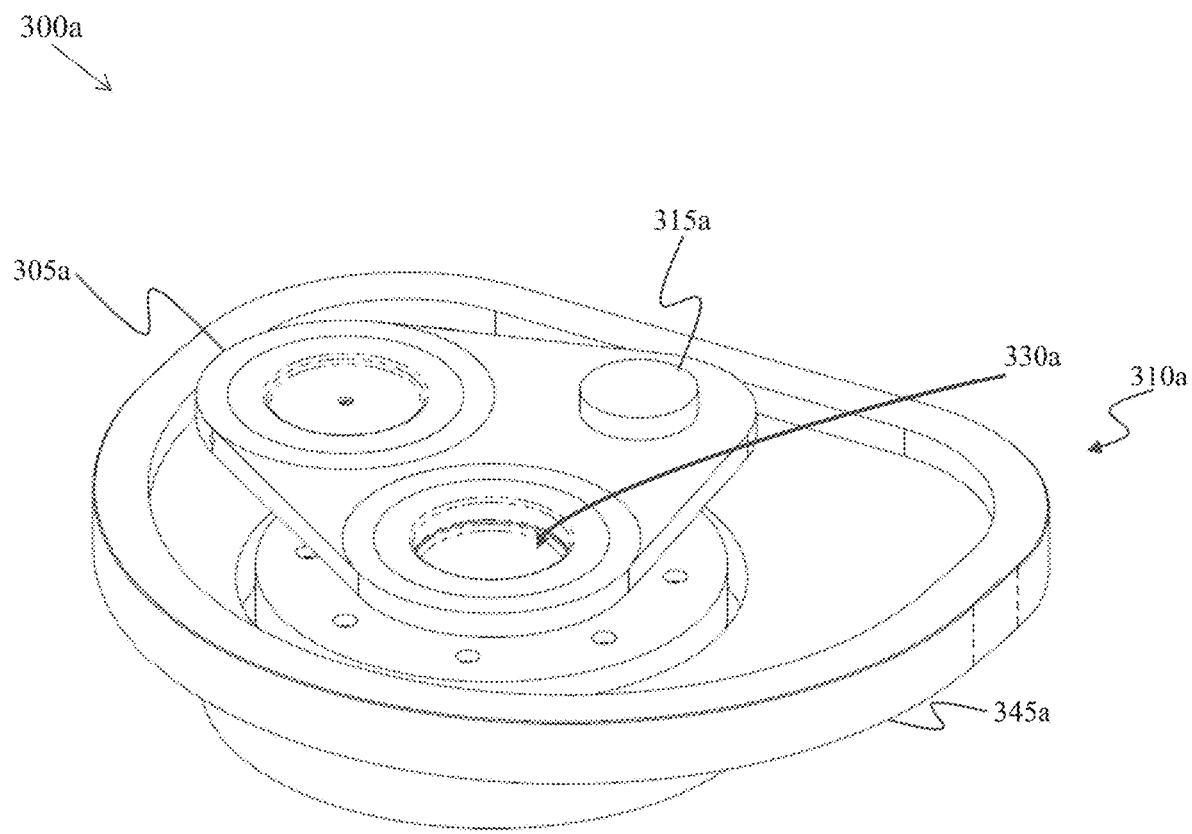
FIG. 3A is a diagram of a first embodiment of an isolation valve according to embodiments of the technology described herein.

FIG. 3A is a diagram 300a of a first embodiment of an isolation valve according to embodiments of the technology described herein. Isolation valve 310a comprises valve body 345a, which generally has a rectangular cuboid shape. Seal plate 305a is contained within valve body 345a, and pivots about pivot point 315a to expose different portions of seal plate 305a to aperture 330a to allow or prevent the flow of gas through aperture 330a. As used throughout the specification in reference to isolation valve technology, the term aperture can refer to the full flow path through which a gas is permitted to flow, or prevented from flowing, through the valve body, including any inlet(s) and outlet(s). An inlet can refer to an opening or conduit into which a gas or other substance flows, and an outlet can refer to an opening or conduit from which a gas or other substance flows. In some embodiments, a pneumatic actuator is used to apply a rotational force to pivot point 315a to control which portion of seal plate 305a is exposed to aperture 330a. In some embodiments, a mechanical or electromechanical actuator is used to apply a rotational force to pivot point 315a.

As shown in FIG. 3A, seal plate 305a is a "double throw" seal plate including a first portion including an opening for allowing the flow of gas through aperture 330a, and a second portion that blocks the flow of gas through aperture 330a. In some embodiments, seal plate 305a includes a plurality of portions having openings of different sizes, each of which allows a different amount of gas flow through aperture 330a.

Figure 3B:
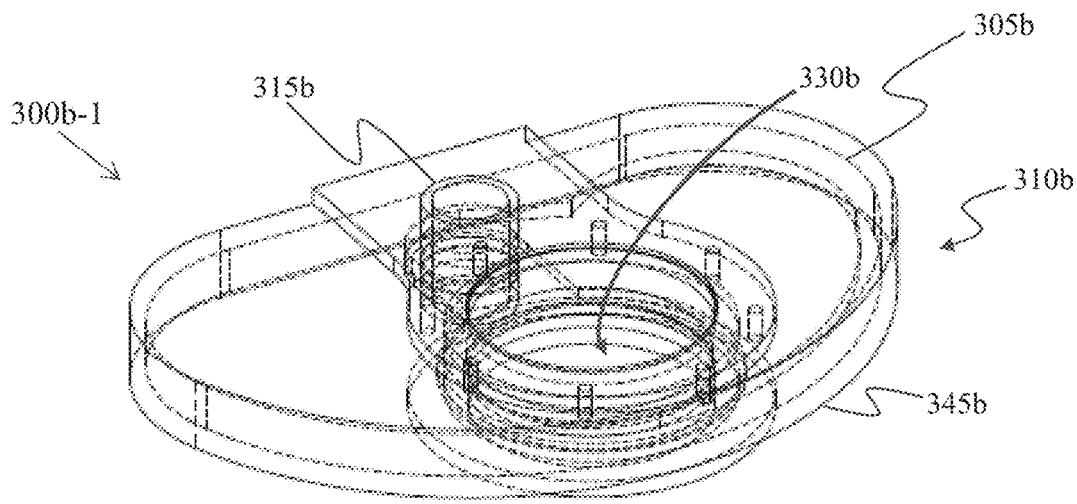
FIG. 3B is a diagram showing 3 views of a second embodiment of an isolation valve according to embodiments of the technology described herein.
Figure 3B:
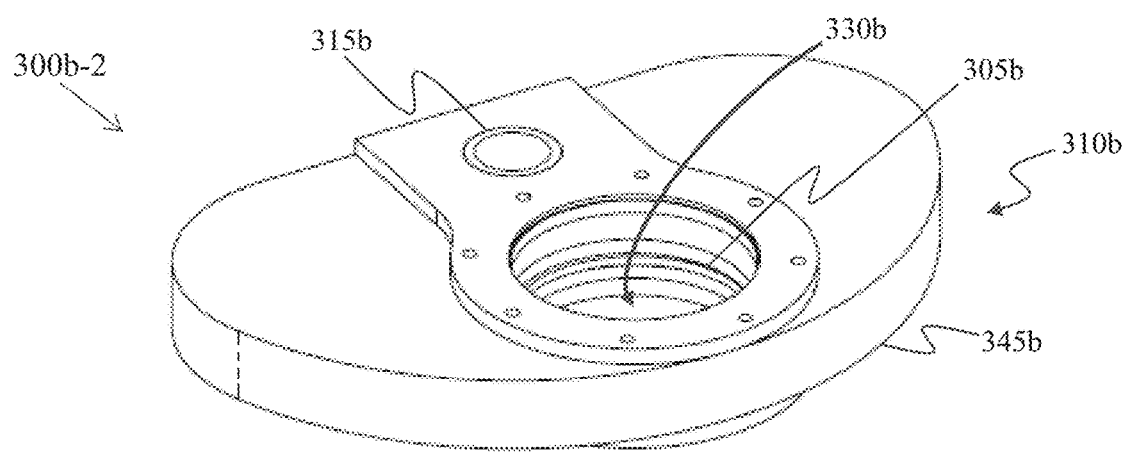
Figure 3B:
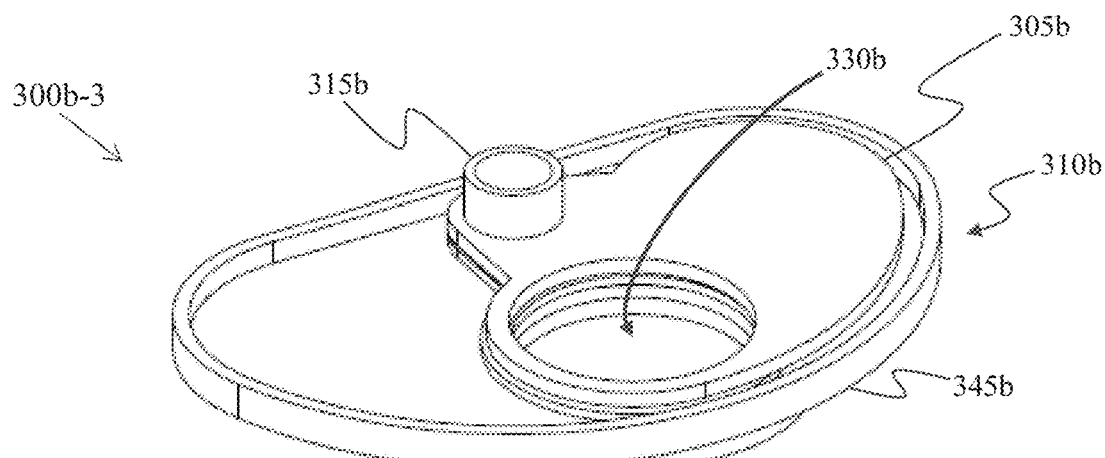

FIG. 3B is a diagram showing 3 views of a second embodiment of an isolation valve according to embodiments of the technology described herein. View 300b-1 is an outline drawing of isolation valve 310b with its surfaces made transparent. View 300b-2 is an outline drawing of isolation valve 310b. View 300b-3 is an outline drawing of a cross section of isolation valve 310b.

The components of isolation valve 310b are similar to isolation valve 310a, but the size and shape of valve body 345b has been optimized around the dimensions of seal plate 305b in isolation valve 310b. The reduced size of the optimized valve body 345b can be beneficial to the installation of system 100, which is often within a facility having limited physical space. In some embodiments, the body of the isolation valve has an irregular shape (e.g., kidney shape), a triangular shape, or a box shape to best accommodate the physical space in which the isolation valve is installed.

Figure 4A:
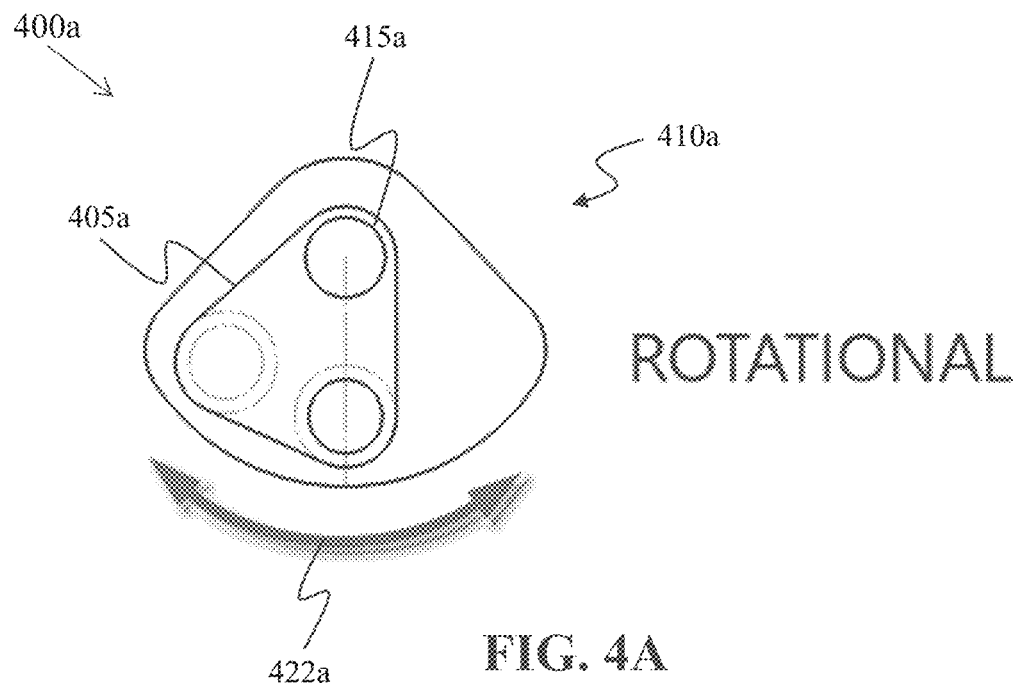
FIG. 4A is a diagram illustrating the rotational motion of a seal plate of an exemplary isolation valve according to embodiments of the technology described herein.
Figure 4B:
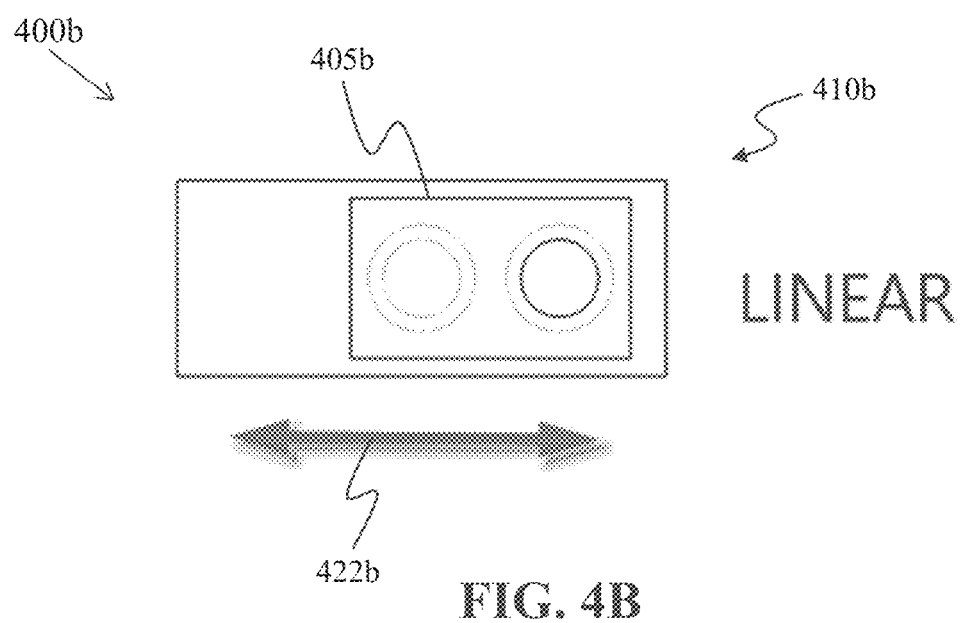
FIG. 4B is a diagram illustrating the linear motion of a seal plate of an exemplary isolation valve according to embodiments of the technology described herein.

FIG. 4A is a diagram 400a illustrating the rotational motion of a seal plate of an exemplary isolation valve according to embodiments of the technology described herein. For example, isolation valve 410a can include seal plate 405a configured to rotate within the valve body about pivot point 415a in a rotational motion 422a. Alternatively, as shown in diagram 400b of FIG. 4B, seal plate 405b can move within isolation valve 410b according to a linear motion 422b. In some embodiments, the type of motion of the seal plate can be chosen to best fit within the physical location in which the semiconductor processing system is installed. Further, although seal plates 405a and 405b in FIGS. 4A and 4B, respectively, are shown as having two positions, embodiments of the valve technology described herein can include a seal plate having three or more positions, and can also incorporate features of other embodiments described herein.

An isolation valve according to embodiments of the technology described herein can include one or more closure elements configured to retain the seal plate stationary in a fixed position. Further, the closure elements can include a sealing element (e.g., o-ring, gasket, etc.) positioned to contact a surface of the seal plate when the closure elements are actuated to retain the seal plate stationary in the fixed position.

Figure 5:
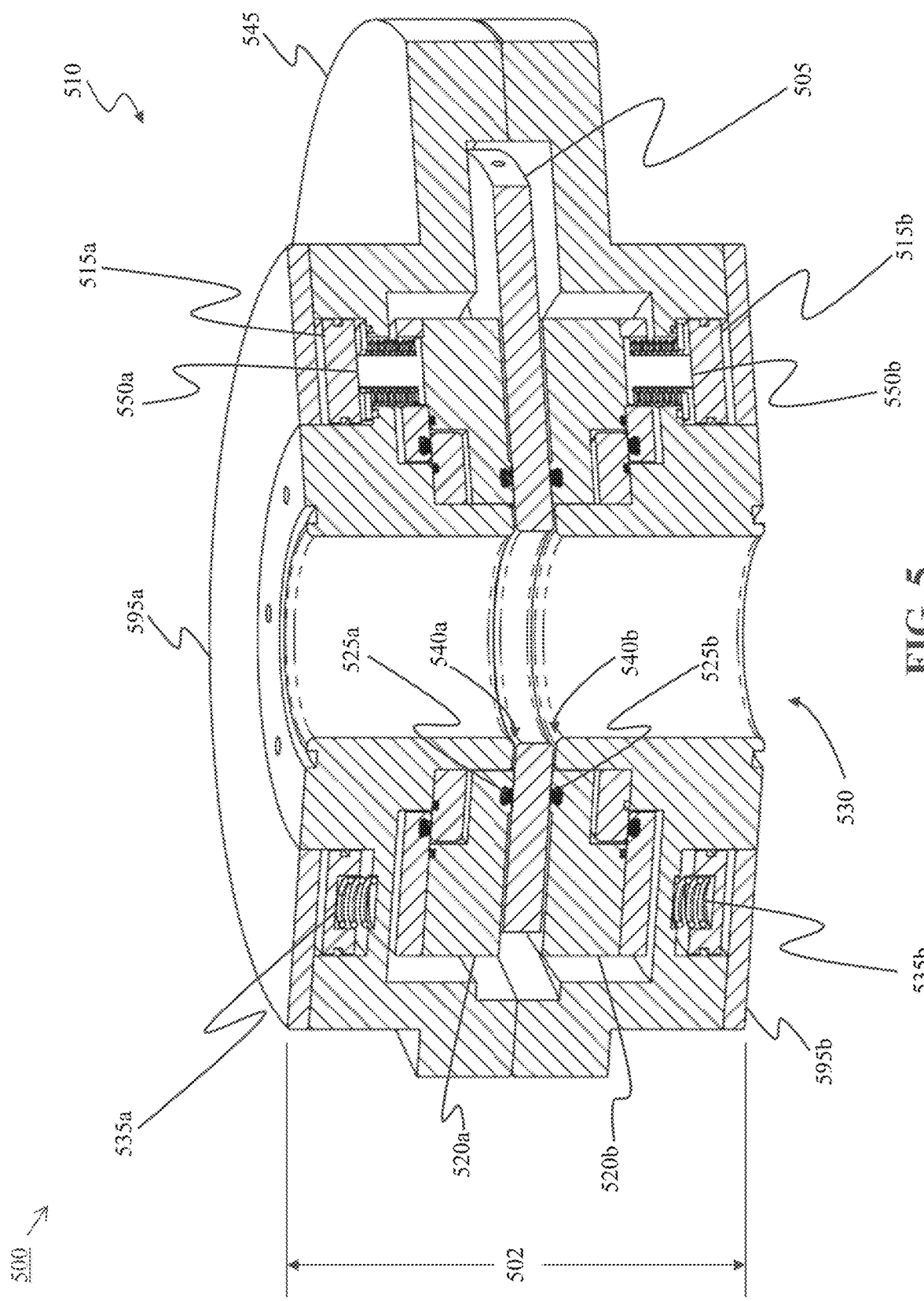
FIG. 5 is a cross-sectional diagram of an exemplary isolation valve according to embodiments of the technology described herein.

FIG. 5 is a cross-sectional diagram 500 of an exemplary isolation valve 510 according to embodiments of the technology described herein. Isolation valve 510 includes valve body 545 which houses seal plate 505, bellows actuator feed-throughs 550a and 550b (collectively referred to as bellows actuators 550), upper pneumatic piston 515a and lower pneumatic piston 515b (collectively referred to as pistons 515), upper spring 535a and lower spring 535b (collectively referred to as springs 535), upper caliper 520a and lower caliper 520b (collectively referred to as calipers 520), upper primary seal 525a and lower primary seal 525b (collectively referred to primary seals 525), upper cap 595a and lower cap 595a (collectively referred to caps 595), and aperture 530. Aperture 530 can be formed in valve body 545 with portions above and below seal plate 505, and provides a path for the flow of gas from its inlet portion where gas is flowed or injected into, to its outlet portion from which a flow of gas exits isolation valve 510 when seal plate 505 is positioned accordingly. Isolation valve 510 can also include structural components housing other sealing elements for preventing gas flow within areas of valve body 545 other than the interface between seal plate 505 and calipers 520.

In some embodiments, valve components such as valve body 545, seal plate 505, and calipers 520 are made from aluminum (e.g., 6061 aluminum) and anodized. In some embodiments, the height 502 of isolation valve 510 is 1.5 to 2 times the diameter of aperture 530. In some embodiments, height 502 is about 2 to about 5 times the diameter of aperture 530. Accordingly, the valve technology described herein provides isolation that meets or exceeds the specifications of a conventional poppet valve while maintaining the compact geometry of a conventional gate valve.

As depicted in FIG. 5, primary seals 525 are embedded in dovetail grooves formed in calipers 520. One of skill in the art will appreciate that other techniques can be used to secure or embed primary seals 525 to or in calipers 520. In some embodiments, primary seals 525 are embedded in the top and bottom sides of seal plate 505. In some embodiments, primary seals are embedded in calipers 520 and in the top and bottom sides of seal plate 505, and the primary seals are offset horizontally from each other.

As depicted in FIG. 5, isolation valve 510 incorporates two bellows actuator feed-throughs (upper bellows actuator feed-through 550a and lower bellows actuator feed-through 550b) located on opposite sides of valve body 545. In some embodiments, isolation valve 510 incorporates more than two bellows actuators. For example, one or more additional upper bellows actuators and one or more additional lower bellows actuators can be positioned on opposite sides of valve body 545 such that they are positioned substantially equidistant from bellows actuators 550, respectively. In some embodiments, the bellows component of the bellows actuators utilized for isolation valve 510 is formed from spring steel (e.g., stainless steel). In some embodiments, a thin coating of aluminum oxide is applied to the outer surface of each bellows as a measure to reduce corrosion caused by exposure to reactive species generated in plasmas such as fluorine-based plasmas. In some embodiments, the bellows are coated with an ALD $AL_2O_3$ coating. One of skill in the art will appreciate that in some embodiments, isolation valve 510 can alternatively incorporate dynamic linear slide actuators or slide seals in place of bellows actuators 550.

During operation, pneumatic actuators (not shown) secured to the top and bottom of valve body 545 simultaneously apply pressure to pistons 515 causing them to travel vertically and compress springs 535 mounted between valve body 545 and pistons 515, and also compress the bellows components of bellows actuators 550. The vertical, linear movement of pistons 515 causes a vertical rod or stem within each of bellows actuators 550 to travel vertically and apply a corresponding linear force against calipers 520, respectively. Calipers 520 are configured to have a range of vertical motion within valve body 545 through which they can travel. In some embodiments, each of calipers 520 has a range of vertical motion of less than 1 mm. In some embodiments, each of calipers 520 has a range of vertical motion of about 0.5 mm to about 3 mm. In some embodiments, each of calipers 520 has a range of vertical motion of about 3 mm to about 5 mm.

The force applied to calipers 520 by bellows actuators 550 in turn causes calipers 520 to be pressed firmly against seal plate 505, which simultaneously locks seal plate 505 in place and compresses primary seals 525 against seal plate 505. This has the advantageous effect of substantially sealing off valve body 545 from exposure to any corrosive or etchant gasses that pass through aperture 530 when seal plate 505 is in a position that enables gas flow (as depicted in FIG. 5), and likewise substantially prevents process gasses from process chamber 106 and any remaining corrosive or etchant gasses from RPS 104 from entering valve body 545 when seal plate 505 is in a position that prevents the flow of gas through aperture 530.

A further advantage of the configuration of isolation valve 510 is that far less of the working surface of each of primary seals 525 is exposed to the flow of corrosive or etchant gasses passing through aperture 530 as compared to conventional isolation valves. For example, the primary sealing element of a state-of-the-art right angle poppet valve is typically an o-ring mounted in the end face of a nosepiece that is retracted and extended to open and close the gas flow path through the valve. In the closed position, the nosepiece is fully extended and the primary sealing element is compressed against a seat surface of the valve aperture inlet, leaving only a small portion of the primary sealing element exposed to gasses that may flow into a small gap between the nosepiece and seat surface. However, when the nosepiece is retracted to open the valve, up to 50% of the surface of the primary sealing element is directly in the path of gas flowing into the inlet of the valve, even if the nosepiece is retracted beyond the top of the valve outlet, which is typically not practicable due to physical constraints.

This configuration of a conventional right angle poppet valve can be the source of several negative effects. First, the primary sealing element is typically fabricated from a perfluoroelastomer material that can degrade quickly when exposed to reactive gasses such as atomic fluorine, and the speed of degradation can be compounded when the gas is flowing at a high velocity. Accordingly, the useable life of the primary seal used in a conventional right angle poppet valve can be less than desired under conditions necessary for certain processes. Further, the transport efficiency of the system is negatively-impacted as gasses such as atomic fluorine are subject to a higher degree of loss as they flow through the valve due to recombination caused by collisions with the nosepiece, the primary sealing element, and the walls of the aperture which include a right angle turn in the path between the valve inlet and outlet. In addition, because the nosepiece typically cannot be fully retracted due to physical constraints, a portion of it protrudes into the valve aperture, reducing the maximum achievable gas flow rate through the valve an increasing recombination. Even when using valves designed to have a stoke length sufficient to fully retract the nosepiece (which typically renders them impractical from a physical size standpoint), there is still a loss due to recombination, as the nosepiece and primary sealing element are exposed to the flow of gas, even if only tangentially. Finally, recombination is an exothermic reaction that generates a large amount of heat which gets conducted into the components of the valve. Temperatures within the valve body can quickly exceed the rated operating temperature of the primary sealing element (typically around 210° C.), and reach 300° C. or more.

One alternative to the right angle poppet valve is an inline valve with an angled seat, which can reduce some of the negative effects discussed above. For example, when the nosepiece of such an inline valve is retracted to open the valve, the primary sealing element is typically not located directly in the path of gas flowing between the valve inlet and the valve outlet, which are horizontally aligned to form a straight flow path. This configuration can reduce the number of collisions between gasses flowing through the valve aperture and components of the valve such as the nosepiece, the primary sealing element, and the walls of the aperture. However, there is still a pronounced loss of transport efficiency due to recombination, as the nosepiece and primary sealing element are exposed to the flow of gas, even if only tangentially. Further, while the useable life of an angle seat isolation valve primary sealing element can typically exceed that of the right angle poppet valve primary sealing element, it is still markedly deficient under certain conditions. For example, the portion of the primary sealing element located closest to the valve inlet when the angle seat valve is open degrades at an accelerated rate when exposed to volumes of gas flowing at a high velocity.

In contrast to the right angle poppet valve and inline isolation valve, the isolation valve 510 described herein significantly reduces or eliminates the negative effects described above. As an initial matter, the configuration of isolation valve 510 substantially obscures primary seals 525 from any corrosive or etchant gasses regardless of whether seal plate 505 is positioned such that the gas flow path though aperture 530 is fully open, partially open, or closed because only a minimal portion of each of primary seals 525 are exposed. In part, this is because primary seals 525 are compressively sealed against seal plate 505 during operation of isolation valve 510. When primary seals 525 are compressed against seal plate 505, there are only small crevices or gaps (e.g., gap 540a and gap 540b, collectively referred to as "gaps 540") between the top and bottom surfaces of seal plate 505 and the respective surfaces of valve body 545 and calipers 520. In some embodiments, between about 0.5% and about 1% of the surface of each of primary seals 525 is exposed to gasses flowing though gaps 540 when primary seals 525 are in a compressed state. In some embodiments, between about 1% and about 5% of the surface of each of primary seals 525 is exposed to gasses flowing though gaps 540 when primary seals 525 are in a compressed state. In some embodiments, between about 5% and about 10% of the surface of each of primary seals 525 is exposed to gasses flowing though gaps 540 when primary seals 525 are in a compressed state.

In addition, gasses resident in, or flowing through, aperture 530 can only reach primary seals 525 via gaps 540 by traveling perpendicular to the main flow of gas. Even then, a corrosive gas such as atomic fluorine is typically reduced to a less corrosive and reactive form (e.g., molecular fluorine) by recombination reactions caused by collisions of the atomic fluorine with surfaces of valve body 545 and seal plate 505 as the gas makes its way through gaps 540 toward primary seals 525.

In some embodiments, valve body 545 is constructed such that the paths between primary seals 525 and gaps 540 are "labyrinths" having one or more direction changes. In such a configuration, the recombination effect of gasses flowing through gaps 540 can be increased, further decreasing the likelihood that corrosive gasses are able to reach primary seals 525. In some embodiments, the position primary seals 525 are mounted on calipers 520 is varied to increase the horizontal distance between primary seals 525 and aperture 530, thereby increasing the number of collisions between a gas and the surfaces of valve body 545 and seal plate 505 as the gas makes its way through gaps 540 toward primary seals 525. In some embodiments, primary seals 525 are positioned about 5 mm from aperture 530. In some embodiments, primary seals 525 are positioned between about 10 mm and 20 mm from aperture 530. In some embodiments, primary seals 525 are positioned between about 20 mm and 40 mm from aperture 530.

Reducing the exposure of the working surfaces of primary seals 525 can significantly increase the useable life of primary seals 525 as compared to comparably made primary sealing elements used in conventional isolation valves. In some embodiments, the useable life of primary seals 525 is increased by about 2 to 10 times the life of comparably made primary seals used in conventional isolation valves. In some embodiments, the useable life of primary seals 525 is increased by about 10 to 50 times the life of comparably made primary seals used in conventional isolation valves. In some embodiments, the useable life of primary seals 525 is more than 1000 hours of operation or up-time.

Returning to the operation of isolation valve 510, in order to release the compressive forces applied by calipers 520 to seal plate 505, the pneumatic actuators release the pneumatic loads being applied to pistons 515 and forces applied by springs 535 decompressing cause pistons 515, bellows actuators 550, and calipers 520 to return to their initial positions, freeing seal plate 505 to be rotated to other positions. As depicted in FIG. 5, only spring 535a and spring 535b are visible. However, it should be understood that valve 510 can include additional springs mounted between valve body 545 and piston 515b. In some embodiments, there are two or more springs mounted between each of pistons 515 and valve body 545.

The exemplary isolation valve 510 shown in FIG. 5 has a "spring-open" or "normally-open" configuration meaning that upon release of the pneumatic loads applied to pistons 515, forces applied by springs 535 return the corresponding components of isolation valve 510 to an "open" position that allows seal plate 505 to be rotated to a new position within valve body 545. One of skill in the art will appreciate that in some embodiments, isolation valve 510 can alternatively have a "spring-close" or "spring-return" configuration. In such a configuration, pneumatic loads are applied to pistons 515 to cause the components of isolation valve 510 to move to an "open" position that allows seal plate 505 to be rotated to a new position within valve body 545, and springs return the corresponding components of isolation valve 510 to the compressed or "closed" position upon release of the pneumatic loads applied to pistons 515. Further, in some embodiments, isolation valve 510 can be constructed to have a "double-acting" or "dual pneumatic" configuration that uses forces applied by pneumatic actuators to alternate the corresponding components of isolation valve 510 between the open and closed/compressed states.

Once the compressive forces applied by calipers 520 are released, seal plate 505 can be repositioned to expose a different portion of seal plate 505 to aperture 530. For example, as described above in reference to FIG. 3A, a pneumatic actuator can be used to apply a rotational force to a pivot point (not shown in FIG. 5) to control which portion of seal plate 505 is exposed to aperture 530. In some embodiments, a mechanical or electromechanical actuator can be used to apply a rotational force to the pivot point to control the movement of seal plate 505. Once seal plate 505 has been rotated to the desired position, the process above is repeated to lock seal plate 505 in its new position within valve body 545 and to again compress primary seals 525 against seal plate 505.

Although described herein as distinct components, one of skill in the art will recognize that calipers 520 can be a unitary body or component, and can also be an assembly of two or more components. Further, in some embodiments of the isolation valve technology described herein, only one of primary seals 525 is compressively sealed against seal plate 505 during operation of isolation valve 510, therefore substantially obscuring or shielding one primary seal from any corrosive or etchant gasses passing through aperture 530. In some embodiments, isolation valve 510 comprises one primary seal.

In some embodiments, isolation valve 510 incorporates thermal management features to prevent overheating due to energy dissipated by chemical processes, and to maintain the temperature of isolation valve 510 above the condensation point of exposed processes. In some embodiments, valve body 545 and seal plate 505 include a plurality of fluid channels formed within them through which a gas or liquid coolant is flowed. In some embodiments, the liquid coolant is water, glycol, CDA, dielectric fluorine-based fluid from Galden® or a similar liquid. In some embodiments, the coolant is supplied to the fluid channels of seal plate 505 via its pivot point. In some embodiments, one or more of pistons 515, bellows actuators 550, and calipers 520 incorporate fluid channels for circulating a coolant. In some embodiments, heat pipes are incorporated in the components of isolation valve 510 for thermal management. In some embodiments, components of isolation valve 510 use conduction for thermal management. In one example, thermal energy from calipers 520 is conducted to valve body 545 and seal plate 505 when primary seals 525 are in a compressed state.

Figure 6A:
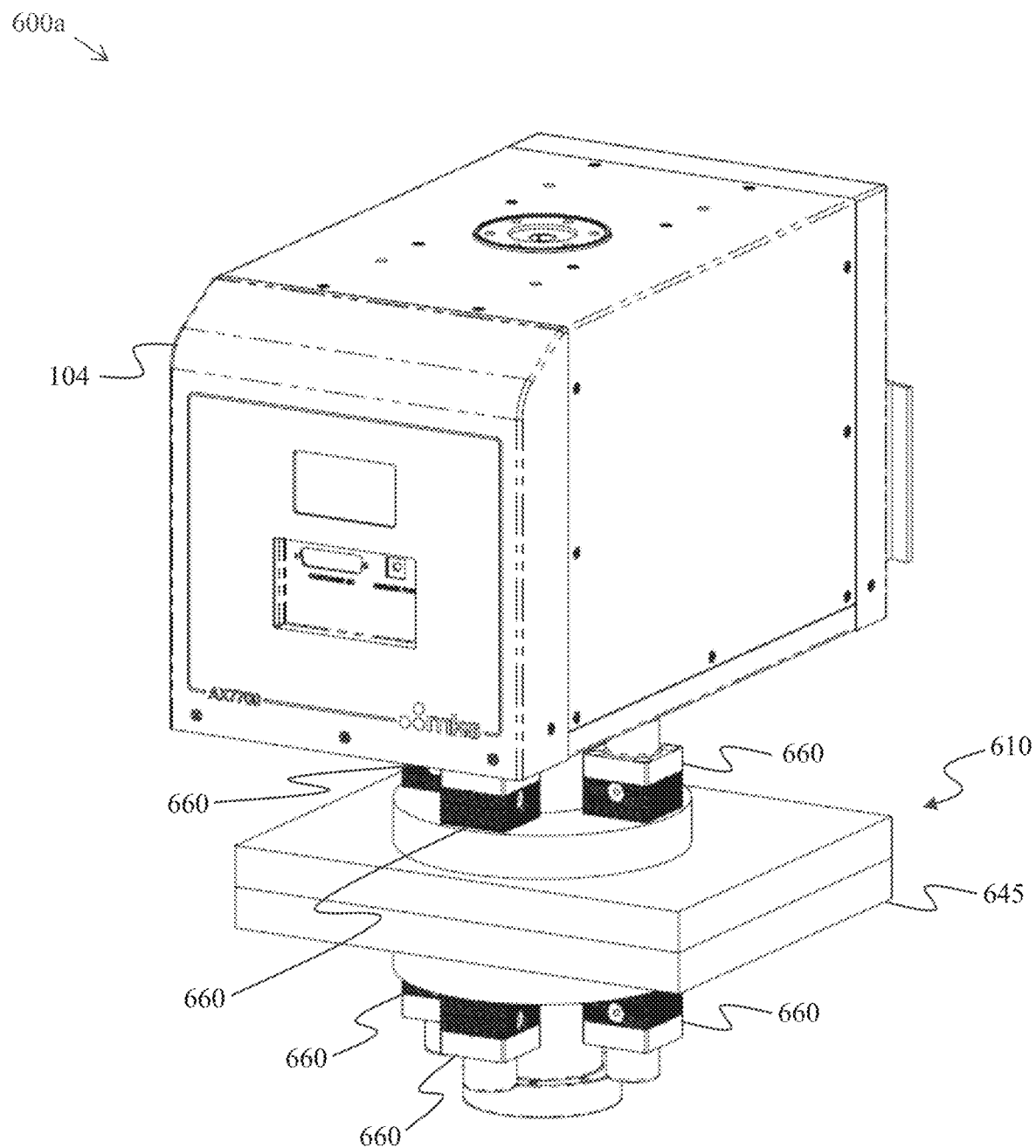
FIG. 6A is a block diagram of an RPS connected to an isolation valve according to embodiments of the technology described herein.

FIG. 6A is a block diagram 600a of an RPS 104 connected to an isolation valve 610 according to embodiments of the technology described herein. Isolation valve 610 includes many of the same features and components as isolation valve 510. However, isolation valve 610 utilizes a plurality of pneumatic actuators (e.g., actuators 660) to extend and retract the calipers within valve body 645. In some embodiments, actuators 660 are based on International Organization for Standardization ("ISO") valve actuators.

As depicted in FIG. 6A, isolation valve 610 incorporates eight actuators 660, with four upper actuators and four lower actuators located on opposite sides of valve body 645. In some embodiments, isolation valve 610 incorporates more than eight actuators 660.

Figure 6B:
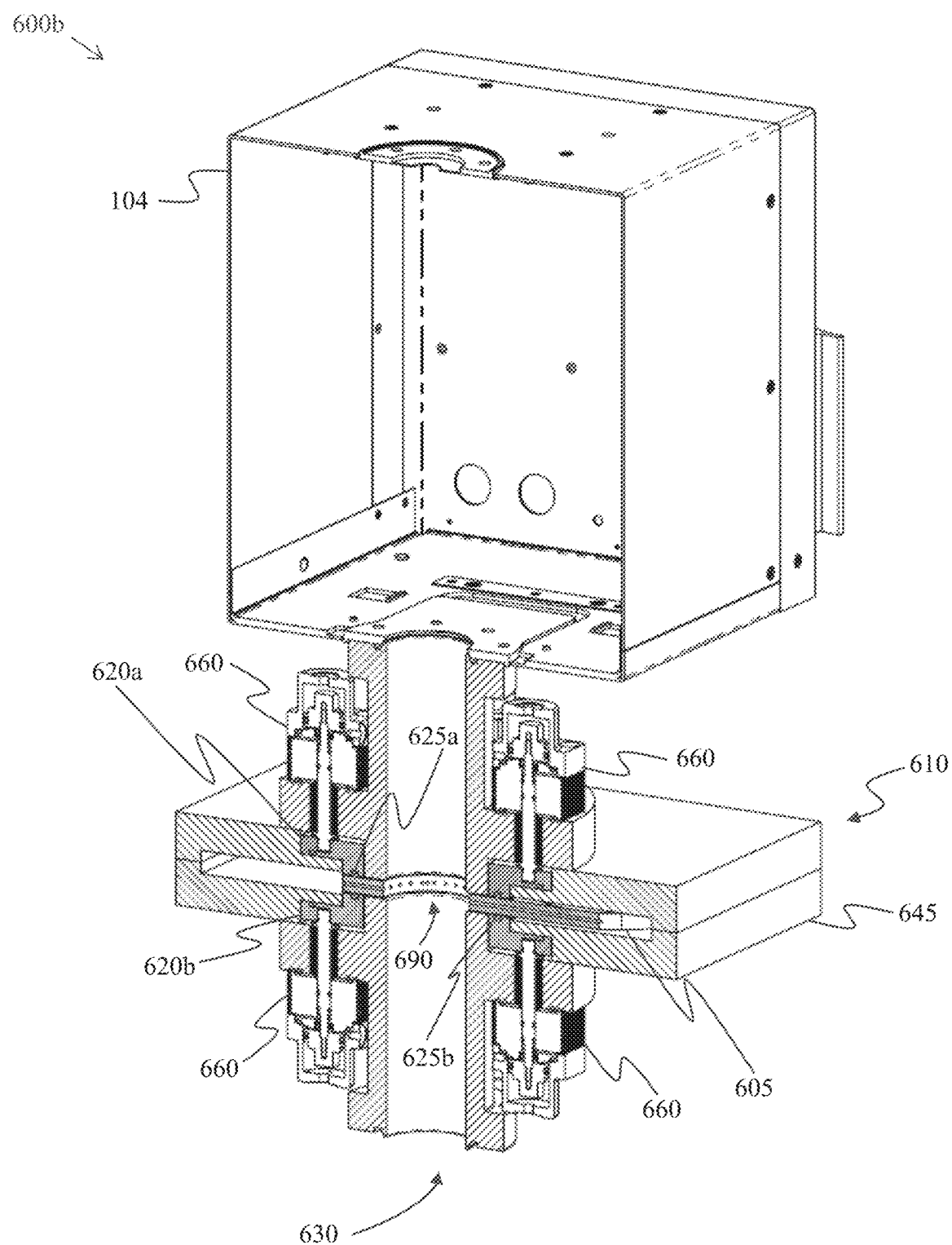
FIG. 6B is a cross sectional diagram an RPS connected to an isolation valve according to embodiments of the technology described herein.

FIG. 6B is a cross sectional diagram 600b of the embodiment shown in FIG. 6A. As shown, a vertical rod or stem within each of actuators 660 extends into caliper 620a or caliper 620b (collectively, "calipers 620"), respectively, depending on the location of each of actuators 660.

In operation, actuators 660 are operated substantially simultaneously to extend calipers 620 and compress primary seal 625a and primary seal 625b (collectively, "primary seals 625") against seal plate 605. As shown in FIG. 6B, seal plate 605 is in a position within valve body 645 that closes the gas flow path through aperture 630. In order to change the position of seal plate 605, actuators 660 are operated substantially simultaneously to retract calipers 620, and seal plate 605 can be rotated to a new position within valve body 645 in a substantially similar manner as described above in reference to FIG. 5. As with the exemplary isolation valve 510 shown in FIG. 5, isolation valve 610 can have a "spring-open," a "spring-close" or "spring-return," or a "double-acting" or "dual pneumatic" configuration.

In some embodiments, seal plate 605 can include downstream injectors 690 for injecting a process or purge gas into aperture 630. In some embodiments, downstream injectors are formed in a portion of aperture 630 located between seal plate 605 and the outlet of RPS 104. In some embodiments, downstream injectors are formed in a portion of aperture 630 located below seal plate 605.

The next series of drawings illustrate several operational modes of the isolation valve technology described herein, and the corresponding description details the advantages the isolation valve provides.

Figure 7A:
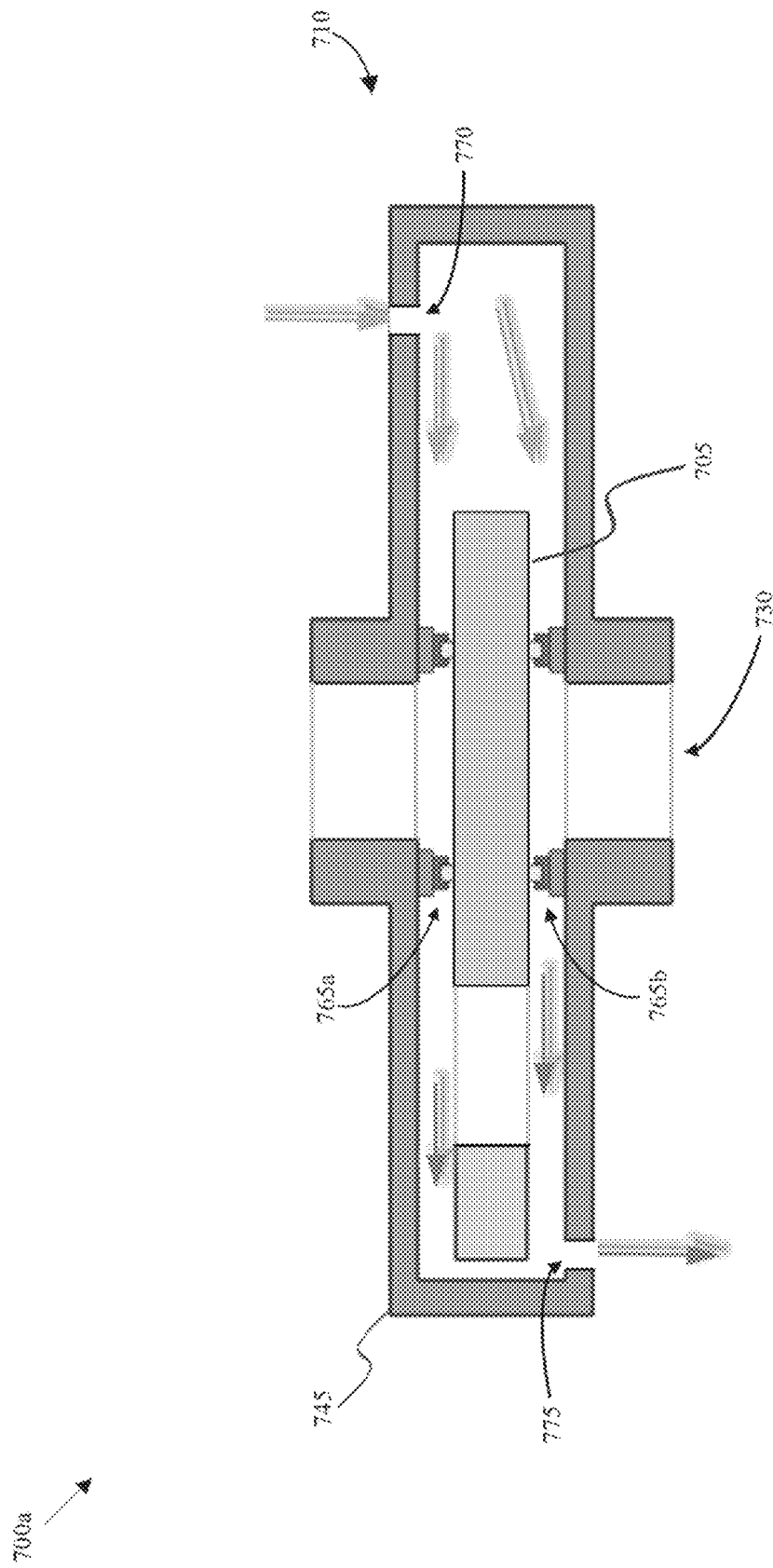
FIG. 7A is a cross sectional diagram of an exemplary isolation valve in a first operational mode according to embodiments of the technology described herein.

FIG. 7A is a cross sectional diagram 700a of an exemplary isolation valve 710 in a first operational mode according to embodiments of the technology described herein. Isolation valve 710 includes similar elements to isolation valve 510 from FIG. 5. For example, among others, isolation valve 710 includes seal plate 705, aperture 730, and valve body 745, which are similar to seal plate 505, aperture 530, and valve body 545, respectively. In cross sectional diagram 700a, the upper piston, bellows actuator feed-throughs, caliper and primary seal are represented by 765a, and the lower piston, bellows actuator feed-throughs, caliper and primary seal are represented by 765b.

Isolation valve 710 further includes an aperture or inlet port 770 for injecting a purge gas (e.g., nitrogen, argon) from valve purge 114 into the interior cavity of valve body 745, and an aperture or outlet port 775 for evacuating the purge gas and residual process gas from the interior cavity of valve body 745 via pump 108. In some embodiments, inlet port 770 includes one or more inlet ports for injecting a purge gas into valve body 745. In some embodiments, outlet port 775 port includes one or more outlet ports for drawing gas from valve body 745. As shown in cross sectional diagram 700a, valve body 745 can be purged when seal plate 705 is in a position that prevents the flow of gas through aperture 730.

One of skill in the art will appreciate that it can be beneficial to the purge process to form outlet port 775 at a position in valve body 745 remote from inlet port 770 to substantially maximize the flow path of the purge gas through the interior cavity of valve body 745. For example, as depicted in FIG. 7A (and in FIGS. 7B-7D described below), outlet port 775 is positioned substantially on the opposite side of valve body 745 as inlet port 770. Further, although inlet port 770 and outlet port 775 are depicted as being formed in the top and bottom surfaces of valve body 745, respectively, either or both of inlet port 770 and outlet port 775 can be formed in a top, side, or bottom surface of valve body 745 according to embodiments of the valve technology described herein. In some embodiments, multiple inlet and outlet ports are formed at various positions in valve body 745 and a subset of the inlet and outlet ports can be selectively utilized according to the type of purge process being performed or the area of the interior cavity the process is intended to purge.

Figure 7B:
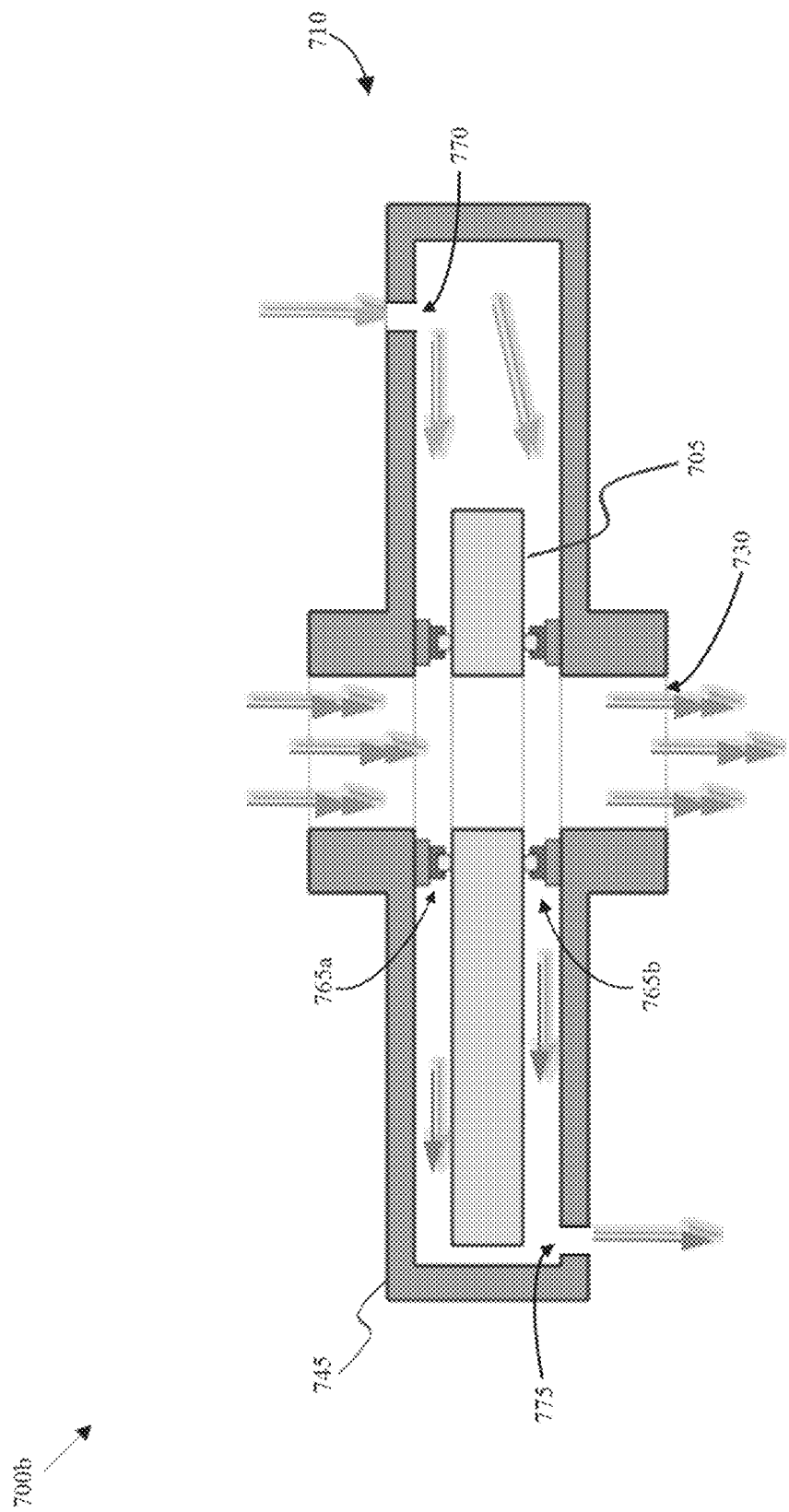
FIG. 7B is a cross sectional diagram of an exemplary isolation valve in a second operational mode according to embodiments of the technology described herein.

FIG. 7B is a cross sectional diagram 700b of isolation valve 710 in a second operational mode according to embodiments of the technology described herein. In cross sectional diagram 700b, seal plate 705 is in a position that enables the flow of gas from an outlet of RPS 104 into an inlet portion of aperture 730, where the gas can continue to flow through aperture 730 via an opening in seal plate 705, and subsequently out of an outlet portion of aperture 730 to process chamber 106. For example, the flow of gas from RPS 104, depicted as double-headed arrows in FIG. 7B, can be an active gas species such as atomic fluorine. In some embodiments, the flow of gas from RPS 104 is a purge gas (e.g., nitrogen, argon), or a plasma (e.g., an argon-based plasma).

Accordingly, the configuration of isolation valve 710 allows valve body 745 to be purged whether seal plate 705 is in a position that prevents (e.g., FIG. 7A) or enables (e.g., FIG. 7B) the flow of gas through aperture 730. Purging valve body 745 advantageously removes backstream process gasses (e.g., fluorine, or deposition gasses) that seep into valve body 745 during processing and are otherwise trapped there. Continually or periodically purging valve body 745 can therefore extend the life of components such as the primary seals that can be deteriorated by exposure to residual process gasses.

Figure 7C:
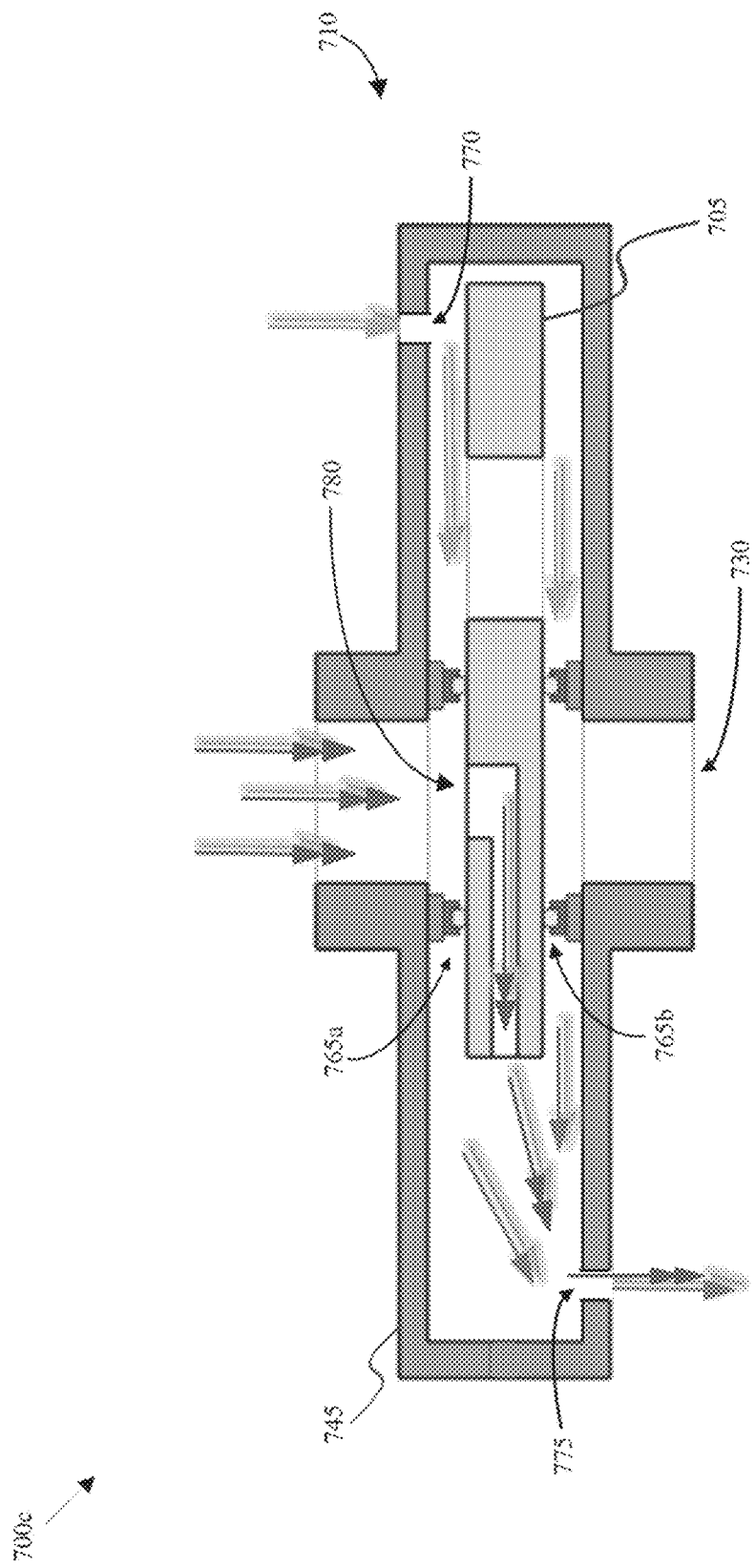
FIG. 7C is a cross sectional diagram of an exemplary isolation valve in a third operational mode according to embodiments of the technology described herein.

FIG. 7C is a cross sectional diagram 700c of isolation valve 710 in a third operational mode according to embodiments of the technology described herein. In cross sectional diagram 700c, seal plate 705 is in a position that prevents the flow of gas from an outlet of RPS 104 through aperture 730 to process chamber 106. However, in this embodiment, seal plate 705 includes bypass port 780 formed through it providing a path from the RPS side of aperture 730 (e.g., the upper portion of aperture 730 as depicted in FIG. 7C) to the interior cavity of valve body 745. In some embodiments, bypass port 780 is made up of a plurality of ports formed within seal plate 705. Further, although seal plate 705 in FIG. 7C is shown as having two positions (e.g., "valve aperture open" and "valve aperture closed with bypass"), as discussed above, some embodiments of seal plate 705 include three or more positions and incorporate features of other embodiments described herein.

A semiconductor processing system utilizing an isolation valve having bypass port 780 provides several advantages over conventional semiconductor processing systems. By way of background, in a conventional semiconductor processing system, during the periods when the RPS is not providing reactive gas to the process chamber, the RPS will be off. Although it is desirable to flow a purge gas (e.g., argon) through the RPS in this state to maintain a known chemistry within the RPS, this is often difficult to implement. There is a risk that the flow of the purge gas and gasses being evacuated by the purge process could interfere with or changes the dynamics of the deposition process occurring in the process chamber, as the flow path from the RPS to the exhaust of a conventional semiconductor processing system necessarily flows through the process chamber.

Due to these concerns, when the RPS is not in use generating a plasma, it is typically powered off and left in a "cold" state with reduced regulation of the chemistry of its internal environment. This can lead to some issues. For example, in the absence of the flow of a purge gas through the RPS, residual gasses, deposition gasses can migrate upstream and condense in the RPS, or upstream of the RPS. If that byproduct is deposited upstream of where the plasma is generated by residual process gasses, it will not be removed during the chamber cleaning process and can become a perpetual source of particulate matter or contamination. Further, the temperature disparity between the hot gasses flowing upstream into the cold chamber of the RPS can cause condensation to form. Coupled with the unregulated chemistry of its internal environment when in the off state, re-ignition performance of the RPS can become inconsistent, which causes undesirable delays in semiconductor processing operations.

A semiconductor processing system utilizing the isolation valve technology described herein overcomes the deficiencies of conventional semiconductor processing systems. In particular, bypass port 780 enables valve body 745 and RPS 104 to be purged simultaneously while other processes (e.g., deposition) are carried out within process chamber 106. For example, a purge gas (e.g., nitrogen, argon) can be flowed through valve body 745 while simultaneously being flowed through the powered down or "passive" RPS 104 to prevent any process gasses from making their way upstream into RPS 104. Finally, a known chemistry can be maintained within RPS 104, thereby eliminating or significantly reducing the RPS re-ignition issues experienced by conventional semiconductor processing systems.

In addition to providing the means for purging valve body 745 and RPS 104 when it is in a passive or powered down state, bypass port 780 also enables simultaneous purging of valve body 745 and RPS 104 while RPS 104 remains in a standby mode where it remains powered on and generating a plasma. For example, after the active gas species has been delivered to process chamber 106 and a subsequent deposition process is taking place, RPS 104 can remain powered on and continue to generate a plasma (e.g., argon plasma). A plasma generated using a gas such as argon is not aggressive enough to damage the components of isolation valve 710. Accordingly, RPS 104 does not need to be disabled before seal plate 705 can be rotated or moved from a position that allows the flow of gas through aperture 730 to a position that prevents the flow of gas through aperture 730, but provides a flow path from the outlet of RPS 104 to the interior of valve body 745 via bypass port 780.

Operation in this mode eliminates the issues with failed RPS re-ignition experienced with conventional semiconductor processing systems discussed above because RPS 104 is never powered down. Further, there is far less thermal cycling of RPS 104 when operating in this mode which subjects the components of RPS 104 to less thermal shock, and results in significantly less condensation being generated on the chamber surfaces of RPS 104 and on nearby components.

In addition, operation in the preceding mode allows preventative maintenance to be performed on RPS 104 without requiring its removal from system 100, and without affecting process chamber 106. In particular, with seal plate 705 positioned as shown in FIG. 7C, a plasma can be generated in RPS 104 with oxygen or another conditioning gas to passivate the surfaces of the chamber of RPS 104. For example, when performed on a remote plasma source having chamber surfaces comprised of anodized aluminum, this process can convert difluoroaluminum ($AlF_2$) that has been deposited on the chamber surfaces during operation to aluminum oxide ($Al_2O_3$). $AlF_2$ can detach from the surface walls over time and becomes a source of contaminating particles for wafers being processed. Accordingly, performing the passivation process before this occurs can reduce or eliminate $AlF_2$ from the chamber surfaces, thereby prolonging the lifetime of the chamber block. Further, these conditioning and maintenance operations are not limited to processing chamber surfaces comprised of anodized aluminum. The valve technology described herein enables conditioning and maintenance processes to be performed on chamber surfaces comprised of materials such as quartz materials, sapphire materials, alumina, aluminum nitride, yttrium oxide, silicon carbide, boron nitride, and/or a metal such as aluminum, nickel or stainless steel.

Figure 7D:
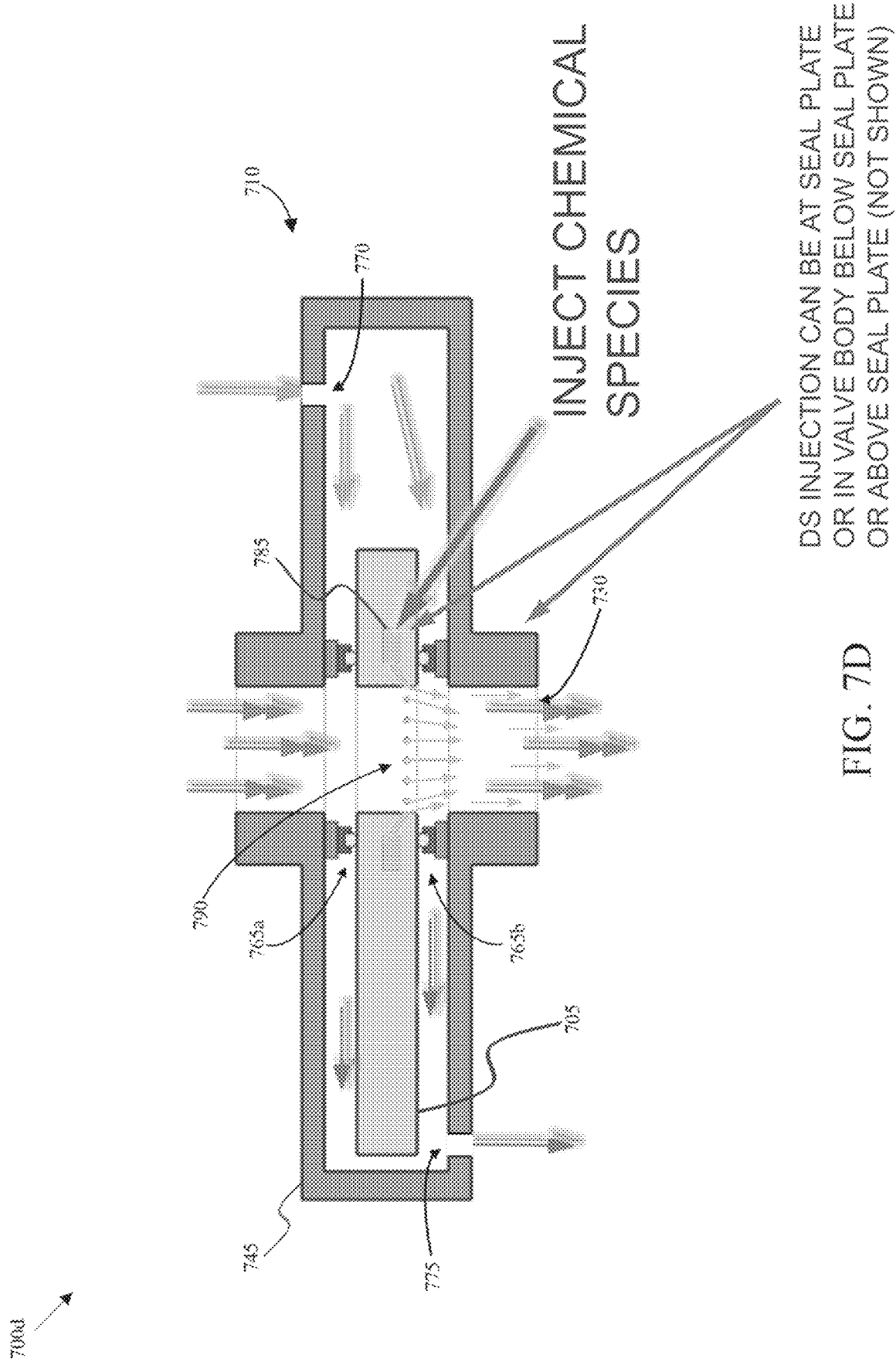
FIG. 7D is a cross sectional diagram of an exemplary isolation valve in a fourth operational mode according to embodiments of the technology described herein.

FIG. 7D is a cross sectional diagram 700d of isolation valve 710 in a fourth operational mode according to embodiments of the technology described herein. In cross sectional diagram 700d, seal plate 705 is in a position that enables the flow of gas from an outlet of RPS 104 through aperture 730 to process chamber 106. However, in this embodiment, seal plate 705 includes one or more channels 785 formed within it for injecting different gasses or chemistries downstream of RPS 104. For example, seal plate 705 can include one or more inlets (not shown) in communication with downstream inject 116 for supplying a process or purge gas (e.g., chemical species, forming gas, water vapor) into channels 785 for injection into aperture 730 via one or more downstream injectors 790. In some embodiments, gas is supplied to channels 785 via a conduit in the pivot point (not shown) of seal plate 705.

As indicated above, system 100 is often installed within a facility having limited physical space. Accordingly, the described configuration of isolation valve 710 can provide a valuable space savings for system 100 since additional equipment does not need to be plumbed into the gas flow path in order to inject different gasses or chemistries downstream from RPS 104.

In some embodiments, one or both of channels 785 and downstream injectors 790 are formed in valve body 745 in the walls of aperture 730 below seal plate 705. In some embodiments, one or both of channels 785 and downstream injectors 790 are formed in valve body 745 in the walls of aperture 730 above seal plate 705. Downstream injectors 790 can be positioned either above or below the seal plate 705.

Further, although seal plate 705 in FIG. 7D is depicted as having two positions (e.g., "valve aperture closed" and "valve aperture open with downstream injection"), as discussed above, some embodiments of seal plate 705 include three or more positions and incorporate features of other embodiments described herein.

FIG. 8 is a flow diagram of a method 800 for directing an output of a remote plasma source operation through a valve body of an isolation valve assembly, according to embodiments of the technology described herein. Method 800 includes securing (805) an outlet of the remote plasma source to an inlet of a valve body of the isolation valve assembly. For example, as described above in reference to system 100, the outlet of RPS 104 can be mounted directly or adjacent to an inlet of the valve body of isolation valve 110.

Method 800 further includes positioning (810) a seal plate disposed within an interior cavity of the valve body in a first position, wherein the seal plate comprises a channel directing gas flow from the inlet to the interior cavity of the valve body when the seal plate is in the first position. For example, an isolation valve having a seal plate with features described in FIG. 7C can be positioned as described in reference to FIG. 5 above to present a bypass path to gas flowing from RPS 104 into the valve inlet.

Method 800 includes providing (815) the output of the remote plasma source operation to the inlet of the valve body via the outlet of the remote plasma source, and evacuating (820) the output of the remote plasma source operation from a first aperture disposed in the valve body.

For example, a purge operation can be carried out in RPS 104. RPS supply 112 can supply a purge gas such as argon to a gas inlet of RPS 104. Referring again to FIG. 7C, the purge gas from RPS 104 (shown in FIG. 7C as lines having two points) can flow into the inlet of isolation valve 710 where bypass port 780 directs it to an interior cavity of valve body 745, and it is evacuating via outlet port 775.

In some embodiments, the output of the remote plasma source operation is a gas generated during a passivation process performed in RPS 104. In some embodiments, the output of the remote plasma source operation is a reactive species generated by a plasma (e.g., argon plasma, oxygen plasma) formed in RPS 104.

In some embodiments, valve body 745 is purged. For example, a purge gas can be supplied to inlet port 770, and can flow from inlet port 770 to outlet port 775 where it is evacuated by a vacuum created by pump 108. In some embodiments, at least one of residual gas and particulate matter are also evacuated from valve body 745.

In some embodiments, the remote plasma source operation and/or evacuation of the output of the remote plasma source operation occurs substantially simultaneously with the purging of valve body 745. Further, because seal plate 705 maintains isolation with process chamber 106 with seal plate 705 in this position, semiconductor processing operations can be performed simultaneously with any of the operations described above.

FIG. 9 is a flow diagram of a method 900 for reacting a chemical species with a reactive species, according to embodiments of the technology described herein. Method 900 includes securing (905) an outlet of a remote plasma source to an inlet of a valve body of an isolation valve assembly. For example, as described above in reference to system 100, the outlet of RPS 104 can be mounted directly or adjacent to an inlet of the valve body if isolation valve 110.

Method 900 further includes positioning (910) a seal plate disposed within an interior cavity of the valve body in a first position, wherein the seal plate comprises a channel directing gas flow from the inlet of the valve body to an outlet of the valve body. For example, an isolation valve having a seal plate with features described in FIG. 7D can be positioned as described in reference to FIG. 5 above to present a flow path from RPS 104 through isolation valve 710 and into an inlet of process chamber 106.

Method 900 includes supplying (915) a reactive species generated in the remote plasma source to the inlet of the valve body. For example, as described above, a reactive species can be generated in RPS 104 and flowed into isolation valve 710. Method 900 further includes injecting (920) one or more chemical species into the reactive species via a plurality of injection ports formed in the seal plate. For example, referring again to FIG. 7D, seal plate 705 can include one or more inlets (not shown) in communication with downstream inject 116 for supplying one or more chemical species into channels 785 for injection into aperture 730 via downstream injectors 790. Injection of the one or more chemical species into aperture 730 while the reactive species flow through can enhance or improve the effects of the process. Further, the design of isolation valve 710 enables valve body 745 to be purged, as described above, substantially simultaneously with the steps of method 900.

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. An isolation valve assembly for a semiconductor processing system, the isolation valve assembly comprising:
   a valve body having an inlet and an outlet;
   a seal plate disposed within an interior cavity of the valve body, the seal plate comprising:
   a first portion including an opening and a second portion, the seal plate being movable between a first position allowing gas flow from the inlet to the outlet via the opening of the first portion, and a second position employing the second portion to prevent gas flow from the inlet to the outlet; and
   at least one coolant channel for conducting a coolant through the seal plate for cooling the seal plate; and
   an actuatable closure element disposed within the valve body, wherein the closure element is configured to (i) press against the seal plate to retain the seal plate stationary in the first position or the second position and (ii) release physical contact with the seal plate when the seal plate is moving between the first and second positions, the closure element comprising a first elastomer sealing element positioned adjacent to a first surface of the seal plate,
   wherein a working surface of the first sealing element is substantially obscured from the gas flow when the seal plate is stationary.

2. The isolation valve assembly of claim 1 wherein the actuatable closure element is configured to use a compressive force to retain the seal plate stationary in the first position or the second position.

3. The isolation valve assembly of claim 1 wherein the first elastomer sealing element provides a seal substantially preventing gas flow between the actuatable closure element and the first surface of the seal plate when the seal plate is stationary.

4. The isolation valve assembly of claim 1 wherein the seal plate is movable between the first position and the second position in a linear motion.

5. The isolation valve assembly of claim 1 wherein a height of the isolation valve assembly is between about 1.5 to about 2 times a measured diameter of either of the inlet and the outlet.

6. The isolation valve assembly of claim 1 further comprising:
a first aperture formed in the valve body for receiving a purge gas into the interior cavity of the valve body; and
a second aperture formed in the valve body for removing one or more of the purge gas and a residual gas from the interior cavity of the valve body, wherein the second aperture is formed in the valve body at a position remote from the first aperture.

7. The isolation valve assembly of claim 6 wherein the seal plate further comprises a channel directing gas flow from the inlet to the interior cavity of the valve body when the seal plate is in the second position.

8. The isolation valve assembly of claim 1 further comprising a plurality of injection ports for injecting one or more chemical species into the gas flow when the seal plate is in the first position.

9. The isolation valve assembly of claim 8 wherein the plurality of injection ports are formed in the seal plate, in the valve body between the seal plate and the inlet, or in the valve body between the seal plate and the outlet.

10. The isolation valve assembly of claim 1 wherein the seal plate is movable between the first position and the second position about a pivot point in a rotational motion.

11. The isolation valve assembly of claim 10 wherein the seal plate further comprises at least one fluid channel in communication with a fluid inlet of the pivot point.

12. The isolation valve assembly of claim 1 wherein the actuatable closure element further comprises a second sealing element positioned adjacent to a second surface of the seal plate.

13. The isolation valve assembly of claim 12 wherein a working surface of the second sealing element is substantially obscured from the gas flow when the seal plate is stationary.

14. The isolation valve assembly of claim 12 wherein the second sealing element provides a seal substantially preventing gas flow between the actuatable closure element and the second surface of the seal plate when the seal plate is stationary.

* * * * *